(12) United States Patent
Kang

(10) Patent No.: US 6,418,043 B1
(45) Date of Patent: Jul. 9, 2002

(54) CIRCUIT FOR DRIVING NONVOLATILE FERROELECTRIC MEMORY

(75) Inventor: Hee Bok Kang, Daejeon (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/490,045

(22) Filed: Jan. 24, 2000

Related U.S. Application Data

(63) Continuation of application No. 09/243,474, filed on Feb. 3, 1999, now Pat. No. 6,091,624, which is a continuation-in-part of application No. 09/210,783, filed on Dec. 15, 1998, now Pat. No. 6,091,622, which is a continuation-in-part of application No. 09/187,735, filed on Nov. 9, 1998, now Pat. No. 6,125,051, which is a continuation-in-part of application No. 09/055,985, filed on Apr. 7, 1998, now Pat. No. 6,118,687.

(30) Foreign Application Priority Data

| Dec. 12, 1997 | (KR) | 97-68192 |
| Apr. 22, 1998 | (KR) | 98-14400 |
| Apr. 22, 1998 | (KR) | 98-14401 |
| Apr. 22, 1998 | (KR) | 98-14402 |
| May 13, 1998 | (KR) | 98-17212 |
| May 26, 1998 | (KR) | 98-19068 |
| Jan. 30, 1999 | (KR) | 99-3121 |

(51) Int. Cl.[7] ............................................. G11C 11/22
(52) U.S. Cl. .............. 365/145; 365/185.23; 365/189.01
(58) Field of Search ........................ 365/145, 185.23, 365/189.01

(56) References Cited

U.S. PATENT DOCUMENTS

| 4,433,390 A | 2/1984 | Carp et al. ................ 364/900 |
| 4,873,664 A | 10/1989 | Eaton, Jr. ................... 365/145 |
| 4,888,630 A | 12/1989 | Paterson .................... 357/23.5 |
| 4,928,095 A | 5/1990 | Kawahara ................... 340/784 |
| 5,148,401 A | 9/1992 | Sekino et al. ............. 365/230.03 |
| 5,371,699 A | 12/1994 | Larson ....................... 365/145 |
| 5,373,463 A | 12/1994 | Jones, Jr. .................... 365/145 |
| 5,608,667 A | 3/1997 | Osawa ........................ 365/145 |
| 5,638,318 A | 6/1997 | Seyyedy ..................... 364/145 |
| 5,680,344 A | 10/1997 | Seyyedy ..................... 365/145 |
| 5,706,245 A | 1/1998 | Kim ........................ 365/230.06 |
| 5,753,946 A | 5/1998 | Naiki et al. ................. 365/145 |
| 5,761,148 A * | 6/1998 | Allan et al. ............. 365/230.06 |
| 5,768,182 A | 6/1998 | Hu et al. ..................... 365/145 |
| 5,815,430 A | 9/1998 | Varhaeghe et al. ......... 365/145 |
| 5,875,149 A * | 2/1999 | Oh et al. ................. 365/230.06 |
| 5,903,492 A | 5/1999 | Takashima .................. 365/145 |
| 5,917,746 A | 6/1999 | Seyyedy ..................... 365/145 |
| 6,011,746 A * | 1/2000 | Oh ......................... 365/230.06 |
| 6,111,808 A * | 8/2000 | Khang et al. ........... 365/230.06 |
| 6,157,588 A * | 12/2000 | Matsumoto et al. ........ 365/214 |

\* cited by examiner

Primary Examiner—Richard Elms
Assistant Examiner—Tuan T. Nguyen
(74) Attorney, Agent, or Firm—Fleshner & Kim, LLP

(57) ABSTRACT

A circuit for driving a non-volatile ferroelectric memory is provided in which a driver has a boost circuit that simplifies a wordline driver and applies a boosted voltage to a wordline without loss of a threshold voltage. The driving circuit increases a current driving capability and increases integration. The memory includes a plurality of split wordline pairs each having a first split wordline and a second split wordline, a plurality of bitlines in a direction crossing the split wordline pairs, and a cell array having a plurality of unit cells each with a switching transistor and a ferroelectric capacitor both coupled between each of the wordline pairs and each of the bitlines. The driving circuit can include an X address signal forwarder having a first plurality of transistors coupled to the global wordline controlled by a global X decoder, a split wordline driving signal forwarder having a second plurality of transistors each for providing a driving signal for drilling the first and second wordline pair under the control of an output voltage of a corresponding one the of the first transistors, and a bypass between the global wordline and the first and second split wordlines for bypassing floating voltages on the split wordlines. The first plurality of transistors can be coupled to the corresponding global wordline in series or in parallel.

26 Claims, 23 Drawing Sheets

E : electric field
P : Polarity

US 6,418,043 B1

CIRCUIT FOR DRIVING NONVOLATILE FERROELECTRIC MEMORY

This appln is a C-I-P of Ser. No. 09/055,985 filed Apr. 7, 1998 U.S. Pat. No. 6,118,687 which is a CIP of Ser. No. 09/187,735 filed Nov. 9, 1998 U.S. Pat. No. 6,125,051 which is C-I-P of Ser. No. 09/210,783 filed Dec. 15, 1998 U.S. Pat. No. 6,091,620 which is a con't of Ser. No. 09/243,474 filed Feb. 3, 1999 U.S. Pat. No. 6,091,624.

BACKGROUND OF THE INVENTION

1. Field of the Invention

The present invention relates to a semiconductor memory, and more particularly, to a circuit for driving a non-volatile ferroelectric memory.

2. Background of the Related Art

A ferroelectric random access memory (FRAM) has a data processing speed as fast as a DRAM and conserves data even after the power is turned off. The FRAM includes capacitors similar to the DRAM, but the capacitors have a ferroelectric substance for utilizing the characteristic of a high residual polarization of the ferroelectric substance in which data is not lost even after eliminating an electric field applied thereto.

FIG. 1 illustrates a general hysteresis loop of a ferroelectric substance. As shown in the hysteresis loop in FIG. 1, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. The state in which a positive voltage is applied to a ferroelectric memory cell is a "c" state in FIG. 1, the state in which no voltage is applied thereafter is a "d" state. Opposite to this, if a negative voltage is applied to the ferroelectric memory cell, the state moves from the "d" to an "f" state, and the state in which no voltage is applied thereafter is an "a" state. If a positive voltage is applied again, the states moves to the "c" state via the "b" state. Thus, a data can be stored in stable states of "a" and "d". On the hysteresis loop, "c" and "d" states correspond to a binary logic value of "1", and "a" and "f" states correspond to a binary logic value "0".

FIG. 2 illustrates a unit cell of a background art ferroelectric memory. The unit cell of a background art ferroelectric memory is provided with a bitline B/L formed in a direction, a wordline W/L formed in a direction crossing the bitline, a plateline P/L formed in the same direction with the wordline spaced therefrom, a transistor T1 having a gate connected to the wordline and a source connected to the bitline, and a ferroelectric capacitor FC1 having a first terminal connected to a drain of the transistor T1 and a second terminal connected to the plateline.

FIGS. 3a and 3b together illustrate a circuit for driving the background art one transistor/one capacitor (1T/1C) ferroelectric memory of FIG. 2. A reference voltage generator 1 generates a reference voltage, and a reference voltage stabilizer 2 having a plurality of transistors Q1~Q4 and a capacitor C1 stabilizes a reference voltage on two adjacent bitlines B1 and B2 because the reference voltage from the reference voltage generator 1 can not be provided to a sense amplifier directly. A first reference voltage storage part 3 having a plurality of transistors Q6~Q7 and capacitors C2~C3 stores logic value "1" and a logic value "0" in adjacent bit lines. A first equalizer 4 having a transistor Q5 equalizes adjacent two bitlines.

A first main cell array 5 connected to wordlines W/L and platelines P/L different from one another stores data, and a first sense amplifier 6 having a plurality of transistors Q10~Q15 and P-sense amplifiers PSA senses a data in a cell selected by the wordline from the plurality of cells in the main cell array part 5. A second main cell array 7 connected to wordlines and platelines different from one another stores data, and a second reference voltage storage 8 having a plurality of transistors Q28~Q29 and capacitors C9~C10 stores a logic value "1" and a logic value "0" in adjacent bit lines. A second sense amplifier 9 having a plurality of transistors Q16~Q25 and N-sense amplifiers NSA senses a data in the second main cell array 7.

FIG. 4 illustrates a timing diagram showing a write mode operation of the background art ferroelectric memory. First, when a chip enable signal CSBpad received externally is enabled from "high" to "low" and a write enable signal WEBpad also transits from "high" to "low", the write mode is started. An address decoding is started in the write mode, to transit a pulse applied to a selected wordline from "low" to "high" to a selected cell. In an interval where the wordline is thus held at "high", a corresponding plateline P/L is applied of a "high" signal for an interval and a "low" signal for an interval in a sequence and a corresponding bitline is applied of a "high" or "low" signal synchronous to the write enable signal, for writing a logic "1" or "0" on the selected cell. In other words, if a signal applied to the plateline is "low" in an interval where the bitline is applied of a "high" signal and the wordline is applied of a "high" signal, a logic value "1"is written in the ferroelectric capacitor. If a signal applied to the plateline is "high" and the bitline is applied of a "low" signal, a logic value "0" is written in the ferroelectric capacitor.

The operation for reading a data stored in a cell with the write mode operation will be explained with reference to FIG. 5. When the chip enable signal CSBpad is enabled from "high" to "low" externally, all bitlines are equalized to "low" by an equalizer signal before selection of a corresponding wordline. As shown in FIGS. 3a and 3b, when a "high" signal is applied to the equalizer 4 and a "high" signal is applied to transistors Q18 and Q19 grounding the bitlines through transistors Q18 and Q19, the bitlines are equalized to a low voltage Vss. The transistors Q5, Q18 and Q19 are turned off, disabling corresponding bitlines, and address is decoded for transiting a corresponding wordline from "low" to "high", to select a corresponding cell. Then, a "high" signal is applied to a plateline of the selected cell, to cancel data corresponding to a logic value "1" stored in a FRAM. If the FRAM is in storage of a logic value "0", a data corresponding to it will not be canceled. A cell with a canceled data and a cell with a data not canceled provide signals different from each other according to the aforementioned hysteresis loop principle. Data provided through the bitline is sensed by the sense amplifier of a logic value "1" or "0".

That is, referring to FIG. 1, since the case of a canceled data is a case when a state is changed from "d" to "f", and the case of a data not canceled is a case when a state is changed from "a" to "f", if the sense amplifier is enabled after a certain time, in the case of the canceled data, the data is amplified to provide a logic value "1", and, in the case of the data not canceled, the data is amplified to provide a logic value "0". After the sense amplifier amplifies and provides a signal, since the cell should be recovered of an original data, during "high" is applied to a corresponding line, the plateline is disabled from "high" to "low". However, in the background art 1T/1C ferroelectric memory, in which the reference cell is operative more than the main memory cell in data input and output operations, the reference cell degrades rapidly.

Accordingly, the background art ferroelectric memory and a circuit for driving the same have various disadvantages. Since one reference cell of a ferroelectric substance of which ferroelectric property is not fully assured is provided for several hundreds cells of main memories for use in reading operation, requiring much more operation of the reference cell, the reference cell experience a rapid degradation of the ferroelectric property, causing instability of the reference voltage and subsequent degradation of device operation performance and life time.

SUMMARY OF THE INVENTION

Accordingly, the present invention is directed a circuit for driving a nonvolatile ferroelectric memory that substantially obviates one or more of the problems due to limitations and disadvantages of the related art and to provide at least the advantages described hereinafter.

An object of the present invention is to provide a circuit for driving a nonvolatile ferroelectric memory which improves device operation performance and life time.

Another object of the present invention is to provide a circuit for driving a non-volatile ferroelectric memory, in which a driver has an NMOS boost circuit for simplifying a system of wordline driver and applying a boosted voltage to a wordline without loss of a threshold voltage, whereby improving a current driving capability and effective use of a layout area.

To achieve these and other advantages in a whole or in parts and in accordance with the purpose of the present invention, as embodied and broadly described, a circuit for driving a memory, the memory including a memory array having a plurality of memory cells, pairs of first and second wordlines extending along a first direction spaced from each other, each pair of first and second wordlines corresponding to one of a plurality of global wordlines extending in the first direction, and a plurality of bitlines extending in a second direction crossing the wordline pairs, each memory cell coupled to a corresponding pair of first and second wordlines and a corresponding bitline, a first address circuit coupled to a global wordline to output first control signals, and a wordline driving signal circuit coupled to the first address circuit and the corresponding pair of first and second wordlines that receives the first control signals to enable the corresponding the first and second wordline.

To further achieve at least the above objects in a whole or in parts according to the present invention, there is provided a semiconductor memory device, including a memory array having pairs of first and second wordlines extending along a first direction spaced from each other, each pair corresponding to one of a plurality of global wordlines extending in the first direction, a plurality of bitlines extending in a second direction crossing the wordline pairs, a plurality of cell arrays having cells respectively coupled to a corresponding pair of first and second wordlines and a corresponding bitline, and a split wordline driver that selectively provides a driving signal to at least two of the cell arrays, and a driving circuit that includes a first address signal forwarder that includes a plurality of first transistors coupled to a global wordline in series, and a plurality of wordline pair driving signal forwarders coupled in parallel between the first address signal forwarder and corresponding pairs of first and second wordlines respectively coupled to first and second cell arrays to drive the corresponding pairs of first and second wordlines.

To further achieve at least the above objects in a whole or in parts according to the present invention, there is provided a circuit for driving a memory, the memory including a cell array of multi-NAND memory cells each with a plurality of transistors coupled in series to a bitline, wherein each of the transistors has a control electrode coupled to one of a plurality of wordlines, the circuit including an address signal circuit coupled to a global wordline to output first control signals, wherein the address signal circuit is controlled by a global decoder, and a wordline driving circuit that selectively applies a plurality of second control signals to the wordlines in sequence according to the first control signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
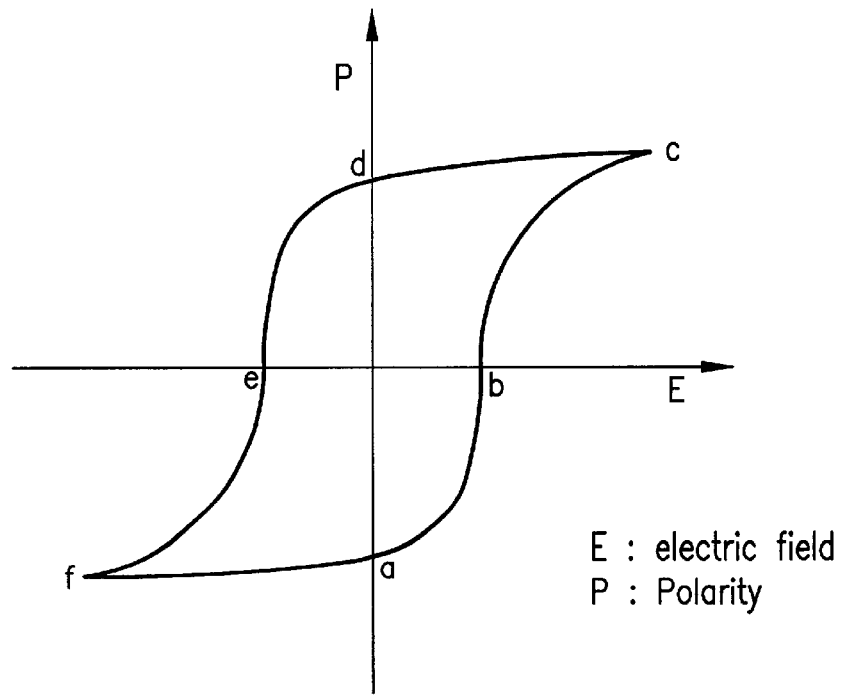
FIG. 1 is a diagram that illustrates a characteristic curve of a general ferroelectric hysteresis loop.
Figure 2:
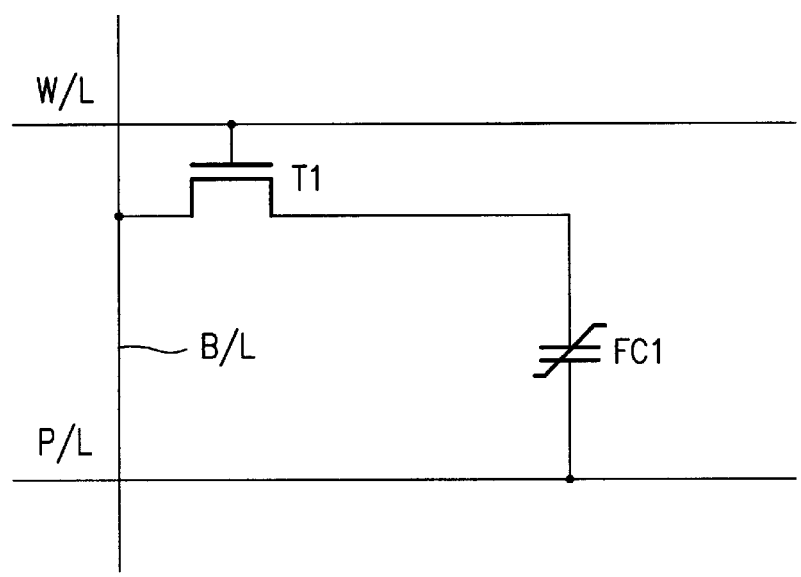
FIG. 2 is a diagram that illustrates a unit cell system of a related art nonvolatile ferroelectric memory.
Figure 3A:
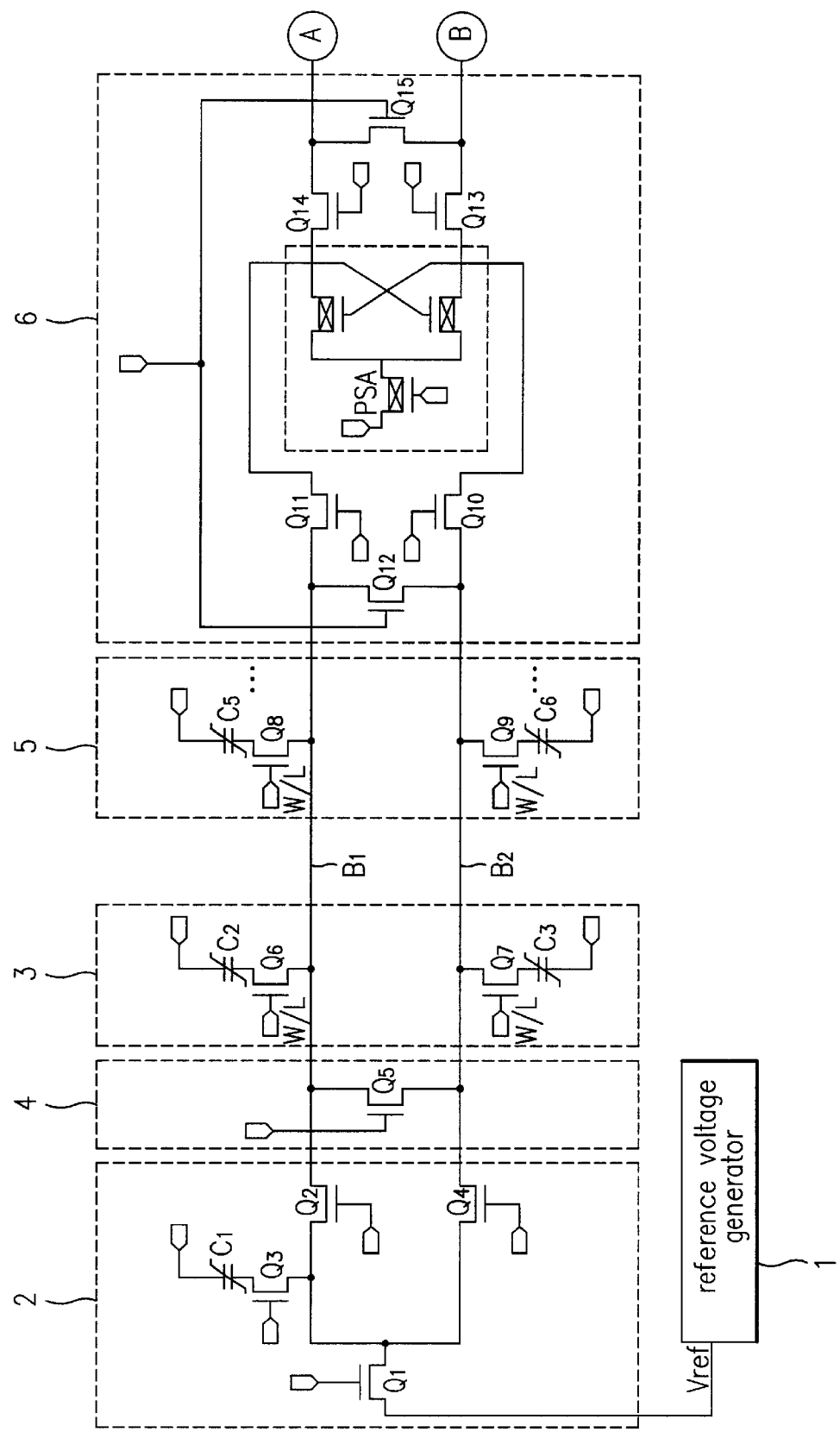
FIGS. 3A–3B are diagrams that illustrate a circuitry system for driving the related art nonvolatile ferroelectric memory.
Figure 3B:
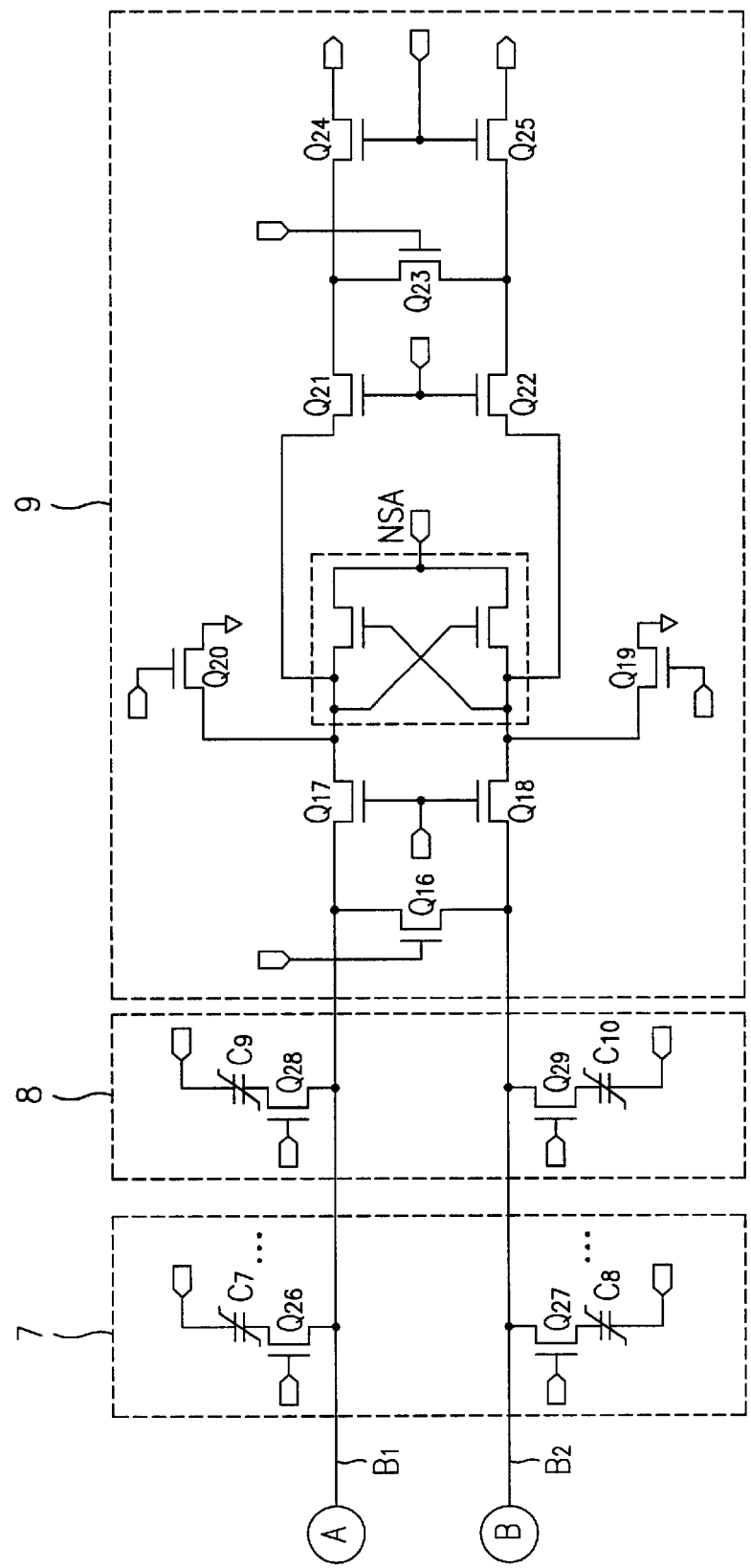
Figure 4:
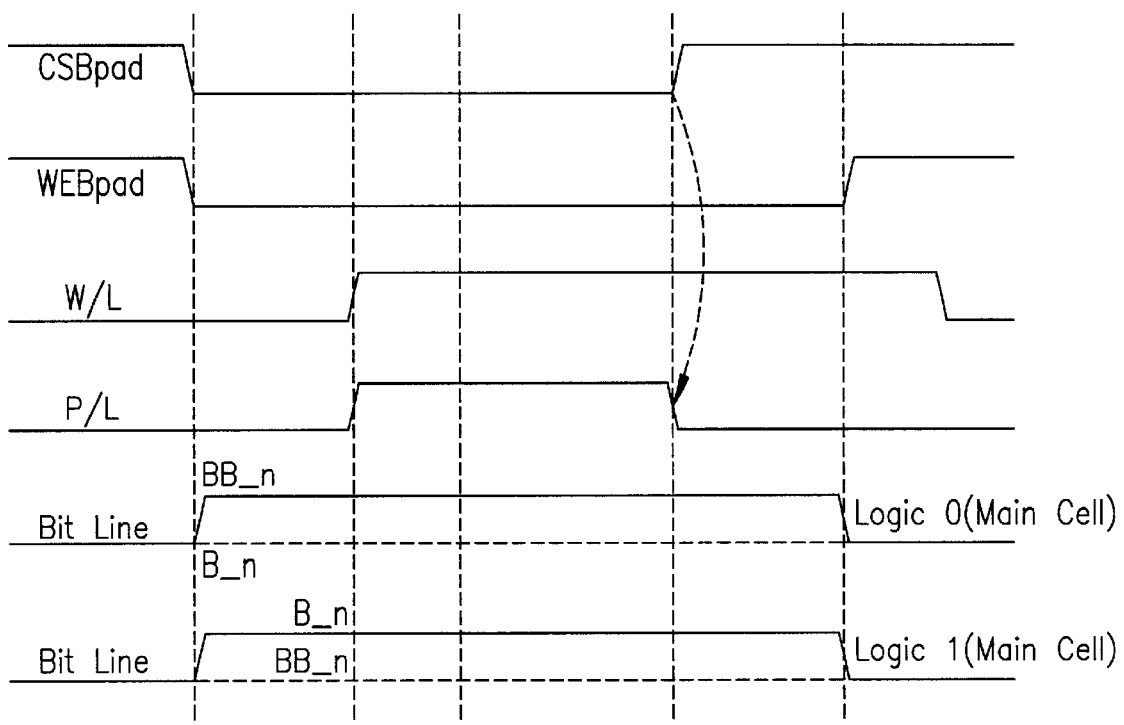
FIG. 4 is a diagram that illustrates a timing diagram of a related art nonvolatile ferroelectric memory in a write mode.
Figure 5:
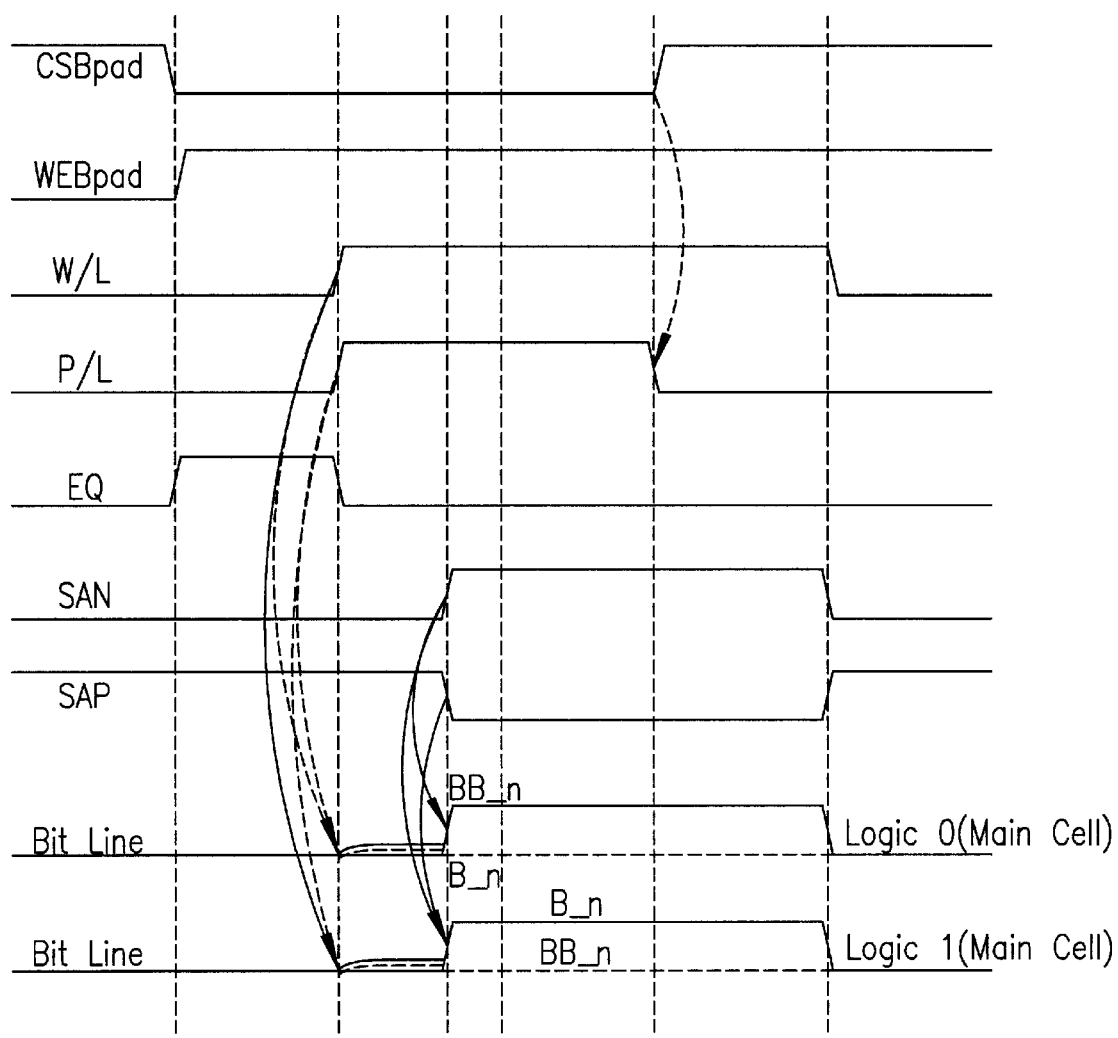
FIG. 5 is a diagram that illustrates a timing diagram of a related art nonvolatile ferroelectric memory in a read mode.
Figure 6:
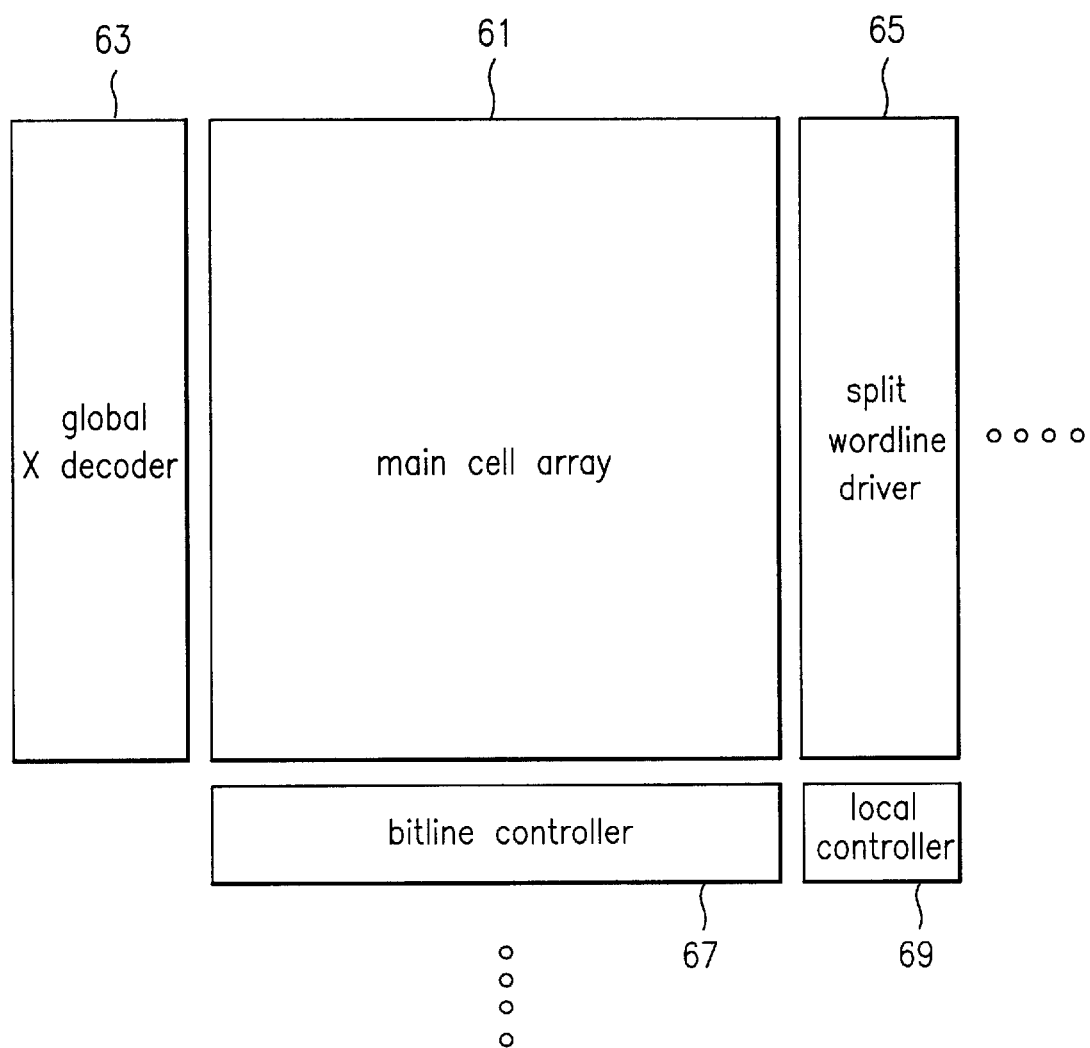
FIG. 6 is a diagram that illustrates a cell array system that can include a circuit for driving a nonvolatile ferroelectric memory in accordance with a first preferred embodiment of the present invention.

FIG. 6 is a diagram that illustrates a cell array system for describing a circuit for driving a nonvolatile ferroelectric memory in accordance with a first preferred embodiment of the present invention. Referring to FIG. 6, the circuit for driving a nonvolatile ferroelectric memory in accordance with a first preferred embodiment of the present invention includes a main cell array 61 having a plurality of sub cell arrays, a global X decoder 63 on one side of the main cell array 61, a split wordline driver 65 on the other side of the main cell array 61, a bitline controller 67 under the main cell array 61, and a local controller 69 under the split wordline driver 65 for providing LC1 and LC2 signals to be applied to the split wordline. The main cell array 61 is inclusive of a reference cell array, and has a plurality of unit cells.

Figure 7:
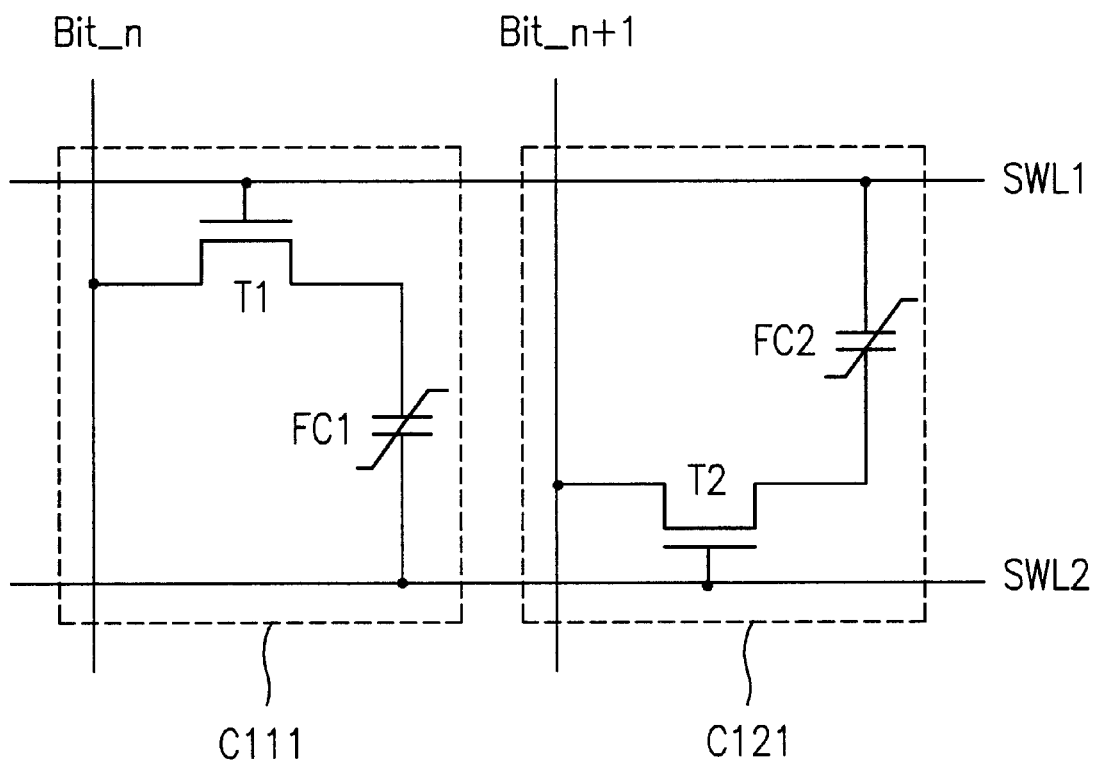
FIG. 7 is a diagram that illustrates a unit cell system in the main cell array shown in FIG. 6.

A unit cell of the main array 61 is illustrated in FIG. 7. Referring to FIG. 7, the unit cell includes a first split wordline SWL1 formed in one direction, a second split wordline SWL2 formed spaced from and in parallel with the first split wordline SWL1, and a first bitline Bit_n and a second bitline Bit_n+1 formed in a direction crossing the first and second split wordlines SWL1 and SWL2. A first switching transistor T1 has a gate terminal coupled to the first split wordline SWL1, a source terminal coupled to the first bitline Bit_n, and a drain terminal coupled to a first terminal of a first ferroelectric capacitor FC1. A second terminal of the first ferroelectric capacitor FC1 is coupled to the second split wordline SWL2. A second switching transistor T2 has a gate terminal coupled to the second split wordline SWL2, a source coupled to the second bitline Bit_n+1, and a drain terminal coupled to a first terminal of a second ferroelectric capacitor FC2. A second terminal of the second ferroelectric capacitor FC2 is coupled to the first split wordline SWL1. Thus, the unit cell preferably includes two split wordlines, two bitlines, and two switching transistors and two ferroelectric capacitors formed between the bitlines and the split wordlines.

Figure 8A:
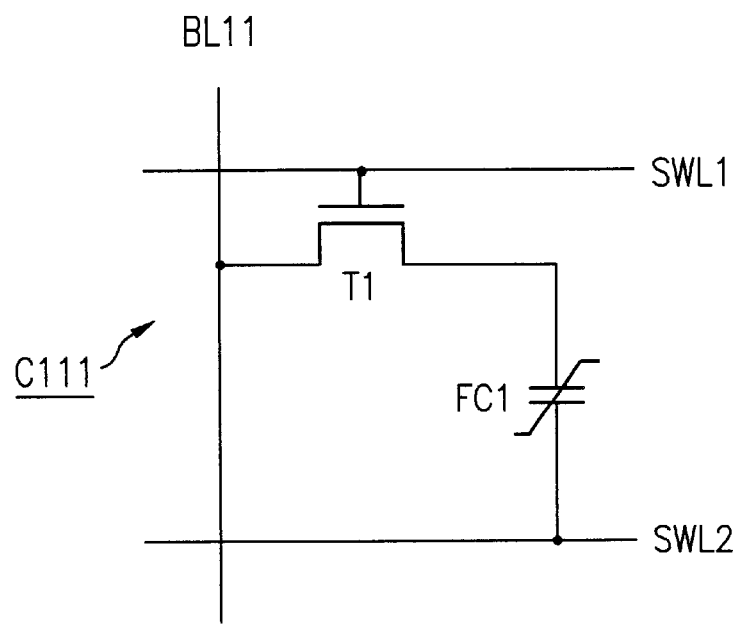
FIGS. 8A and 8B are diagrams that illustrate unit cells of a single transistor and a single capacitor structure.
Figure 8B:
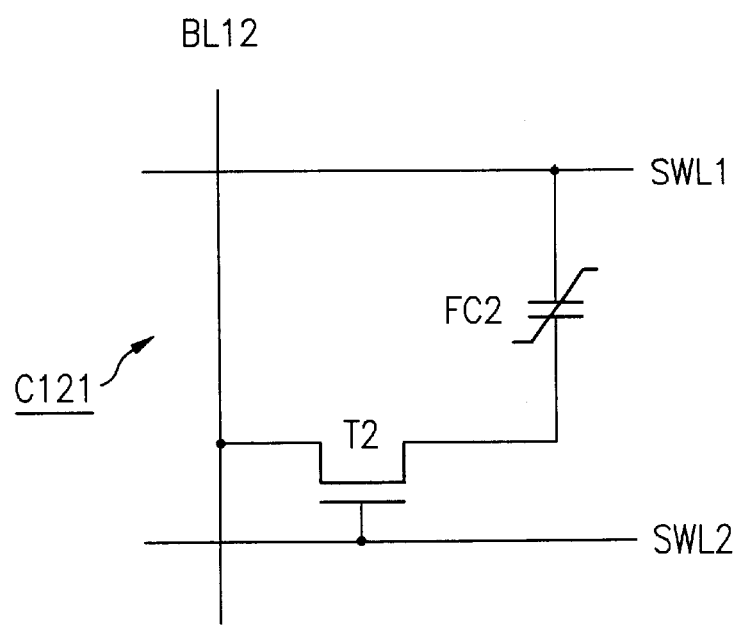

In the meantime, FIGS. 8A and 8B illustrate unit cells of one transistor/one capacitor structure separate from a two transistor/two capacitor structure shown in FIG. 7. When the unit cells in FIGS. 8A and 8B are combined, a memory cell having the two unit cells as one pair is obtained.

Referring to FIG. 8A, one of the unit cells e.g., C111 in the one pair of memory cells includes the first split wordline SWL1, the second split wordline SWL2 formed spaced from and parallel to the first split wordline SWL1 and a bitline BL11 formed in a direction crossing the first and second split wordlines SWL1 and SWL2. A first switching transistor T1 has the gate terminal coupled to the first split wordline SWL1, a source terminal connected to the first bitline BL11, and a first ferroelectric capacitor FC1 formed between the drain terminal of the first switching transistor T1 and the second split wordline SWL2.

Referring to FIG. 8B, the other of the unit cells e.g., C121 in the one pair of memory cells includes the first split wordline SWL1 and the second split wordline SWL2 and a bitline BL12 formed in a direction crossing the first and second split wordlines. The second switching transistor T2 has the gate terminal coupled to the second split wordline SWL2 and the source terminal coupled to the second bitline BL12, and a second ferroelectric capacitor FC2 is disposed between the drain of the second switching transistor T2 and the first split wordline SWL1.

Figure 9:
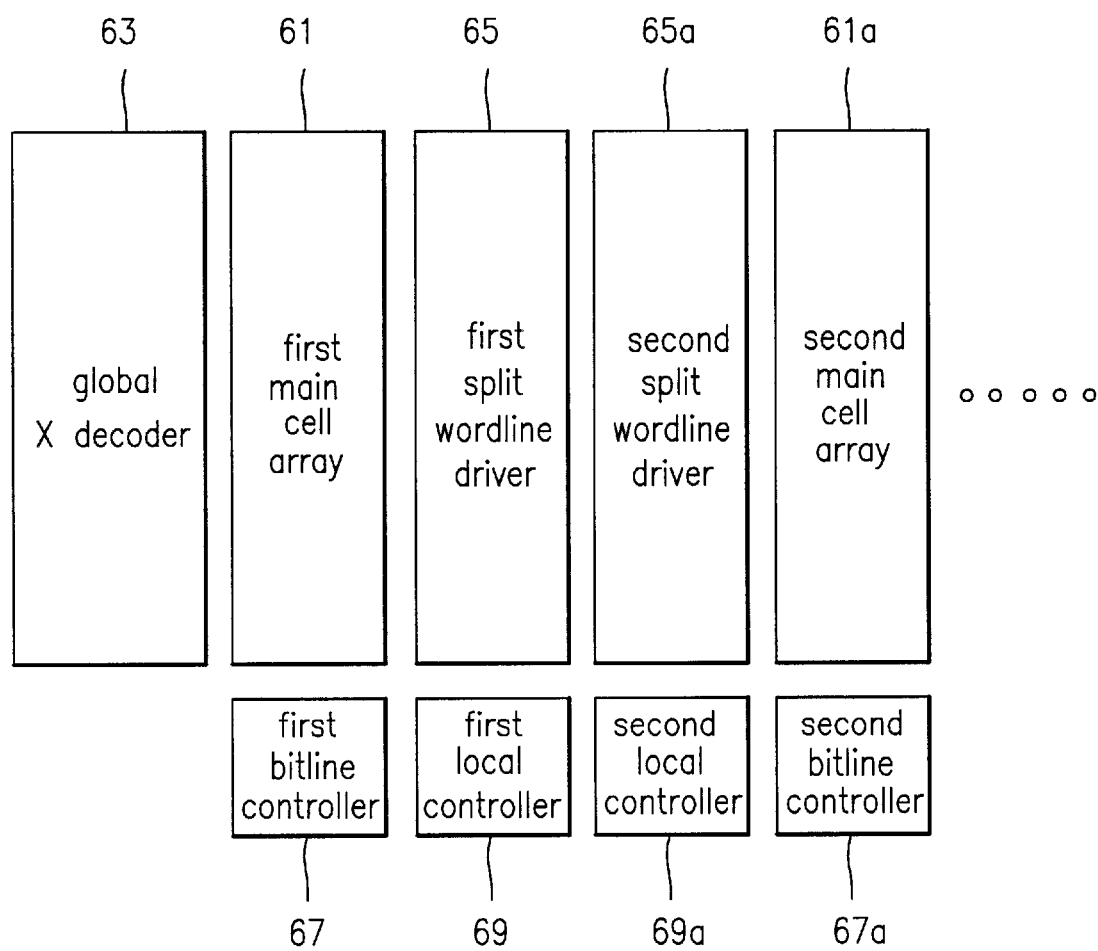
FIG. 9 is a diagram that illustrates an alternate system layout based on a system of FIG. 6.

Upon selectively repeating the system in FIG. 6, a system as shown in FIG. 9 can be obtained. FIG. 9 is a diagram that illustrates a system for effective use of a layout based on the system shown in FIG. 6.

Referring to FIG. 9, the system includes the global X decoder 63, the first main cell array 61 formed on a first side of the global X decoder 63, the first split wordline driver 65 formed on a second side opposite the first side of the first main cell array 61, a second split wordline driver 65a formed adjacent the first split wordline driver 65 and a second main cell array 61a formed adjacent the second split wordline driver 65a. The first bitline controller 67 is preferably formed under the first main cell array 61, the first local controller 69 is preferably formed under the first split wordline driver 65, a second local controller 69a is preferably formed under the second split wordline driver 65a and a second bitline controller 67a is preferably formed under the second main cell array 61a. The system of FIG. 9 can be repeatedly provided. Accordingly, one global X decoder 63 is provided for the two main cell arrays 61 and 61a, and two split wordline drivers 65 and 65a.

Figure 10:
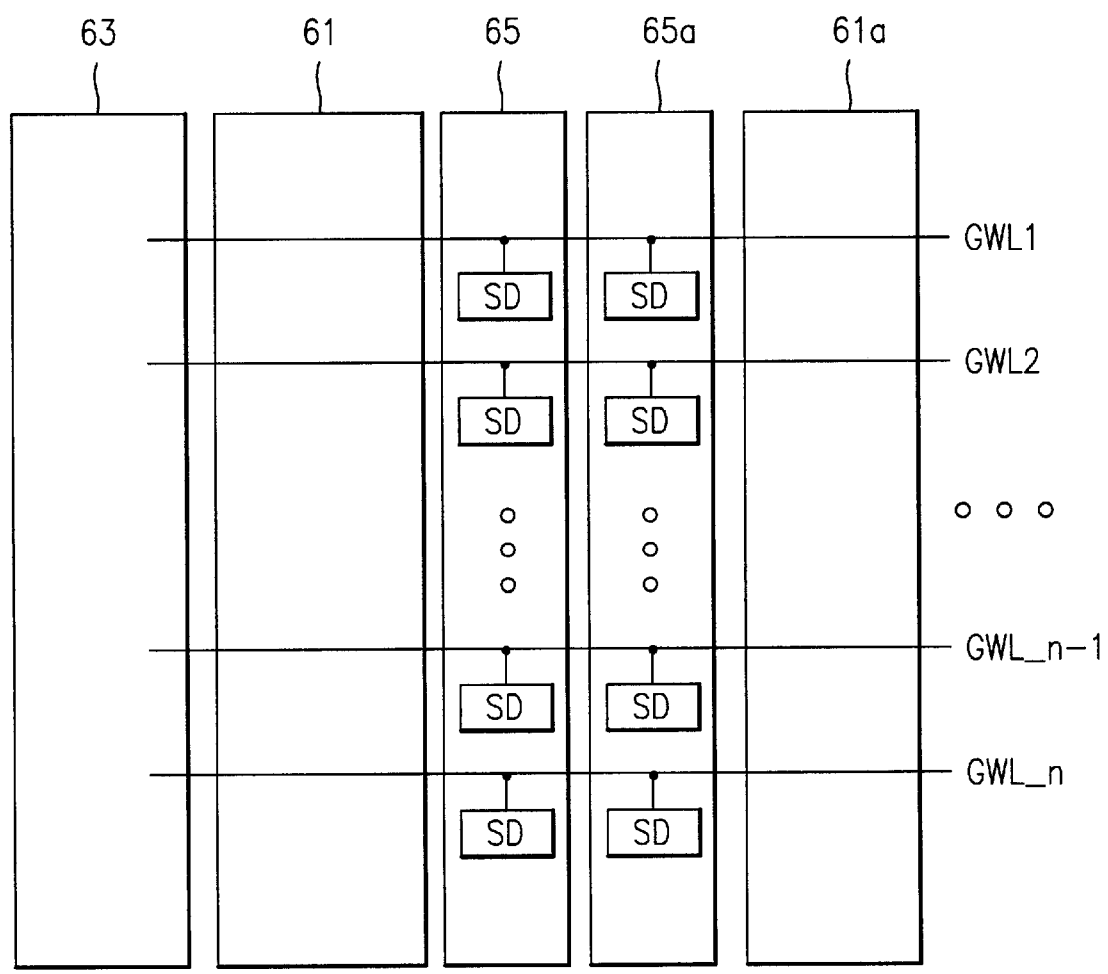
FIG. 10 is a diagram that illustrates additional detail of the system of FIG. 9 centered on the split wordline driver shown in FIG. 6.

FIG. 10 is a diagram that illustrates additional detail of the system shown in FIG. 9 centered on the split wordline driver shown in FIG. 6. As shown in FIG. 10, the two split wordline drivers 65 and 65a are disposed adjacently. Each of the first and second split wordline drivers 65 and 65a have a plurality of sub-drivers SD. Preferred embodiments of a circuit for driving a nonvolatile ferroelectric memory according to the present invention are related to sub-drivers. The global X decoder 63 controls a plurality of global wordlines GWL1, GWL2, . . . , GWLn. The sub-driver SD is coupled to a corresponding global wordline. Each split wordline driver 65 and 65a is provided with the sub-drivers SD equal in number to the respective global wordlines. Each global wordline GWL1~GWLn has the sub-driver of the first split wordline driver 65 and the sub-driver of the second split wordline driver 65a coupled in common.

Figure 11:
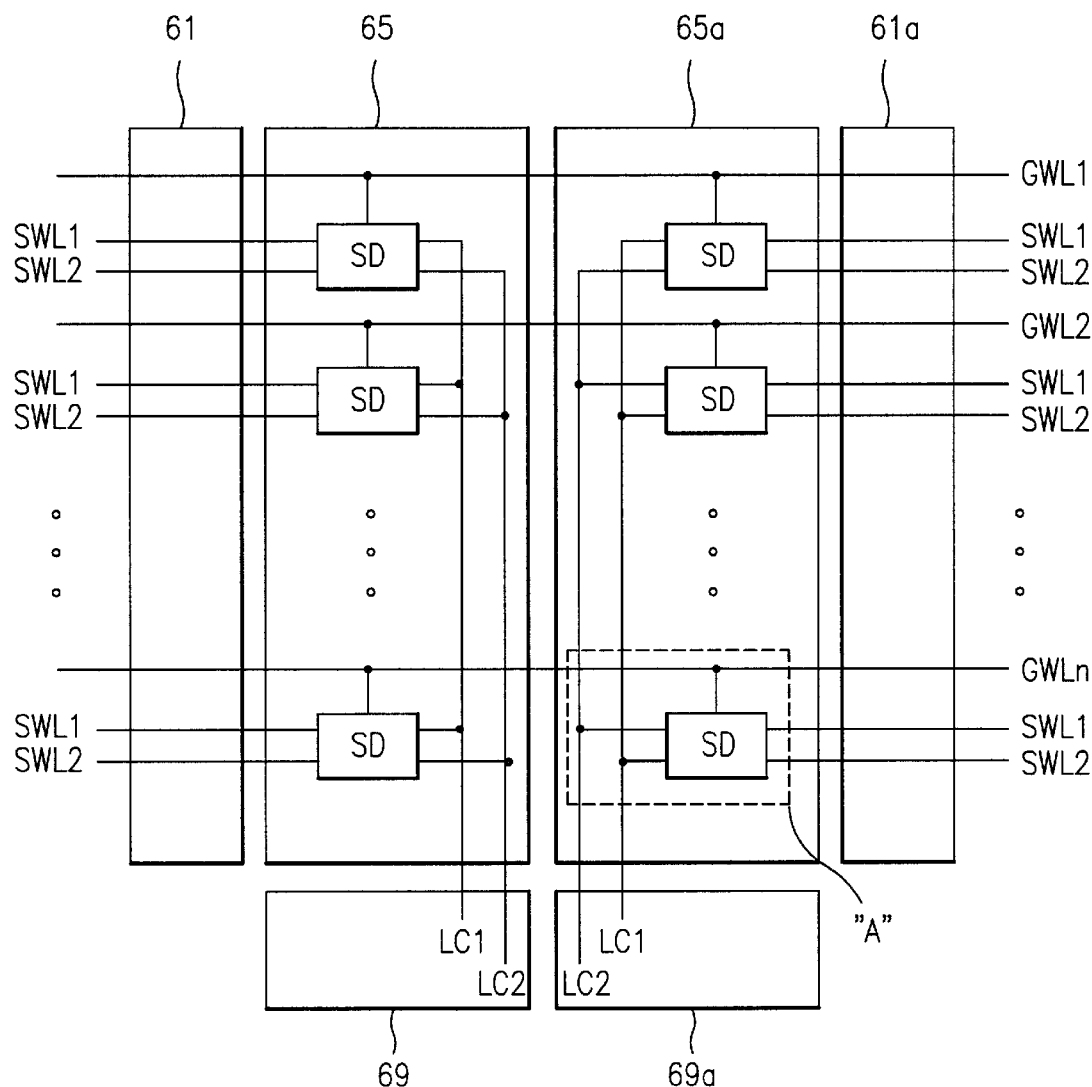
FIG. 11 is a diagram that illustrates a relation between signals LC1 and LC2 from a local controller and a sub-driver shown in FIG. 9.

FIG. 11 is a diagram that illustrates a relation between signals LC1 and LC2 from the local controller and the sub-driver shown in FIG. 9. Referring to FIG. 11, the sub-drivers SD of the first split wordline driver 65 and the second split wordline driver 65a apply signals LC1 and LC2 from the first local controller 69 to the first and second split wordlines SWL1 and SWL2 of the first main cell array 61 in response to a signal on a global wordline GWL from the global X decoder(not shown), and apply signals LC1 and LC2 from the second local controller 69a to the first and second split wordlines SWL1 and SWL2 of the second main cell array 61a.

Figure 12:
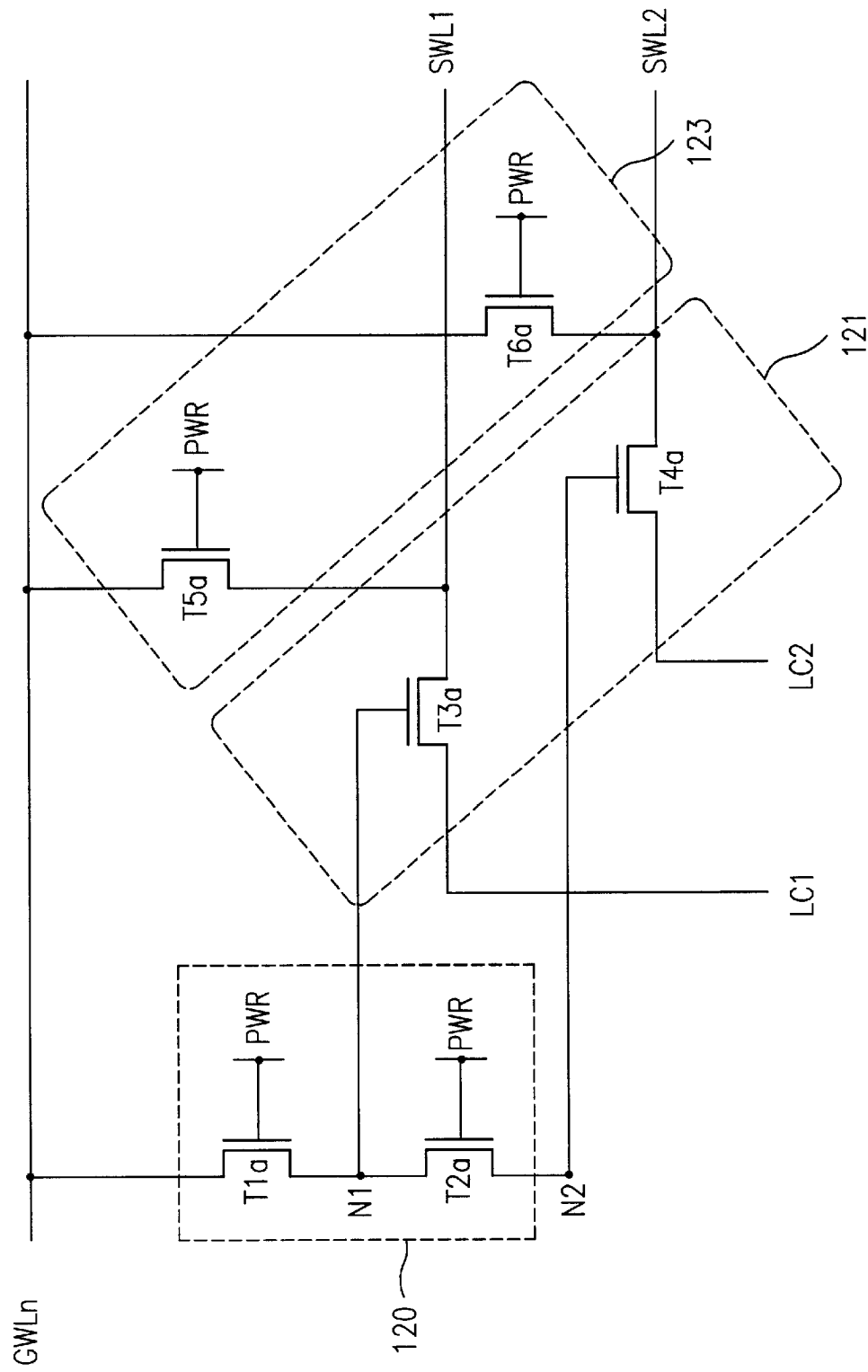
FIG. 12 is a diagram that illustrates "A" part in FIG. 11 in more detail, where a circuit for driving a nonvolatile ferroelectric memory in accordance with a first preferred embodiment of the present invention is shown.

A circuit for driving a nonvolatile ferroelectric memory in accordance with a first preferred embodiment of the present invention will be described. FIG. 12 illustrates "A" part in FIG. 11 in more detail, where a circuit for driving a nonvolatile ferroelectric memory in accordance with a first preferred embodiment of the present invention is shown. The driving circuit shown in FIG. 12 is one of a plurality of driving circuits in a split wordline driver.

Referring to FIG. 12, the circuit for driving a nonvolatile ferroelectric memory in accordance with the first preferred embodiment includes a X address signal forwarder 120 having a first and a second transistors T1a and T2a coupled to the global wordline GWLn from the global X decoder 63 and a split wordline driving signal forwarder 121. The split wordline diving signal forwarder 121 has a third and a fourth transistors T3a and T4a adapted to be controlled by drain voltages of respective transistors in a sequence for applying two control signals LC1 and LC2 from the second local controller 69a to the first split wordline SWL1 and the second split wordline SWL2 in a sequence, and a bypass 123 having a fifth transistor T5a coupled between the first split wordline SWL1 and the global wordline GWLn and a sixth transistor T6a coupled between the second split wordline SWL2 and the global wordline GWLn. Gates of the first and second transistors T1a and T2a and the fifth and sixth transistors T5a and T6a preferably have a power source voltage PWR applied thereto, and each transistor includes an NMOS transistor.

Operations of the circuit for driving a nonvolatile ferroelectric memory in accordance with the first preferred embodiment of the present invention will now be described. When the global wordline GWLn is at "high" and all the signals LC1 and LC2 from the second local controller 69a are at "high", the third transistor T3a is turned on if a drain node N1 of the first transistor T1a transits to "high". Therefore, a high level LC1 signal is provided to the first split wordline SWL1 through the third transistor T3a. Then, if the drain node N2 of the second transistor T2a transits to a high level, the fourth transistor T4a is turned on, to provide the LC2 signal to the second split wordline SWL2. The bypass 123 having the fifth transistor T5a and the sixth transistor T6a serves to bypass a floating voltage of the first split wordline SWL1 and the second split wordline SWL2. In other words, when all of the global wordline GWLn and LC1 and LC2 signals are at a low level, the first split wordline SWL1 and the second split wordline SWL2 are in a floated state. For example, the floating voltage induced on the first and second split wordlines SWL1, SWL2 is preferably bypassed to the global wordline GWLn through the fifth transistor T5a and the sixth transistor T6a. The fifth and sixth transistors T5a and T6a are NMOS transistors preferably having very low driving currents, which are always turned on. Thus, by preventing the first and second split wordlines SWL1 and SWL2 from being floated, unnecessary selection of the cell data is prevented, which reduces or eliminates a possibility that the cell data selected unnecessarily acts as a noise to an actual data.

Figure 13:
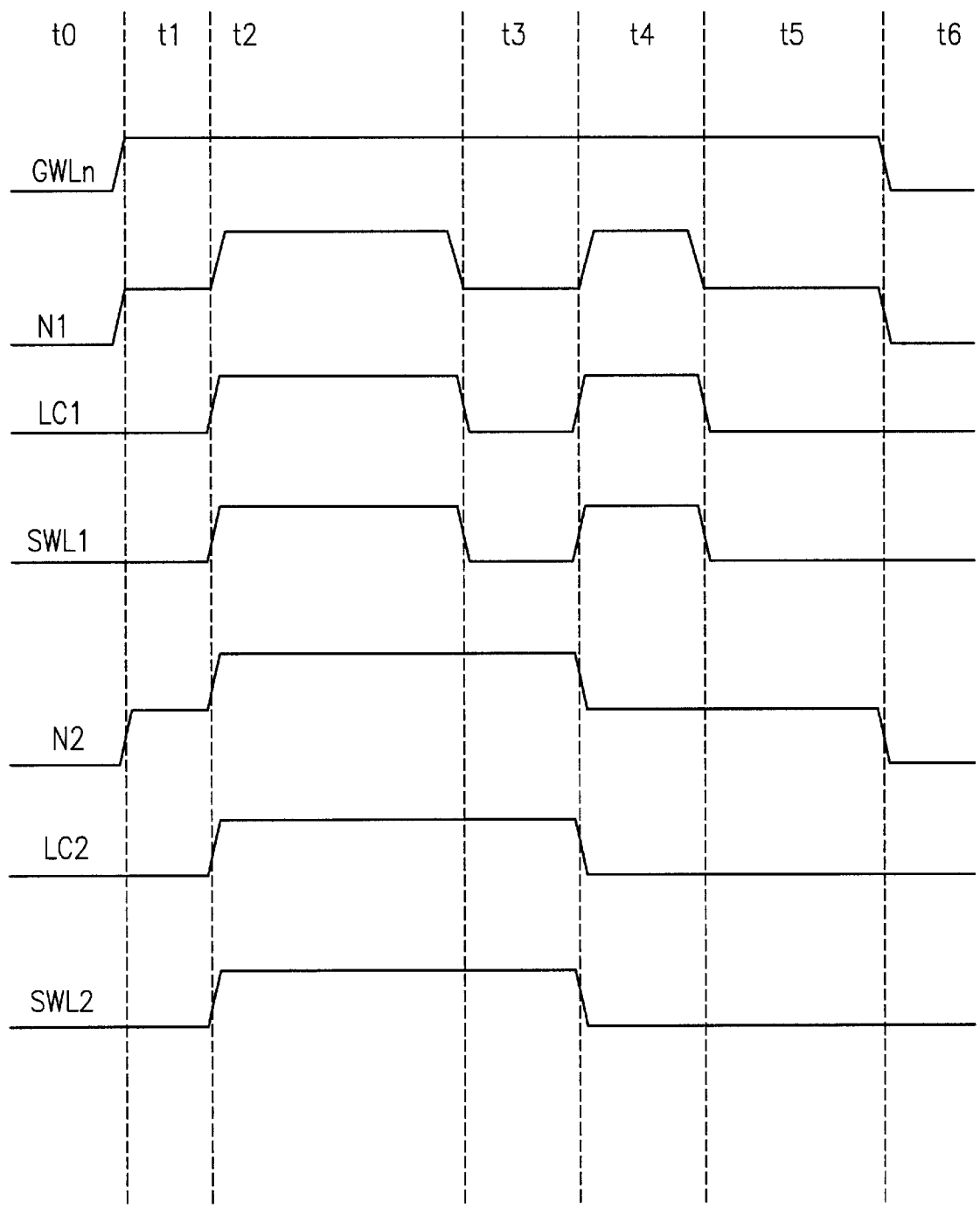
FIG. 13 is a diagram that illustrates a timing diagram of the circuit for driving the nonvolatile ferroelectric memory shown in FIG. 12.

FIG. 13 is a diagram that illustrates exemplary timing of the circuit for driving the nonvolatile ferroelectric memory shown in FIG. 12. As shown in FIG. 13, if it is assumed that a global wordline signal GWLn from the global X decoder 63 is enabled to a high level from t1 period to t5 period, which keeps the first and second transistors T1a and T2a in the X address signal forwarder 120 turned on, a high level signal is provided to the drain nodes N1 and N2 of the first and second transistors T1a and T2a. Since the LC1 and LC2 signals are at low in the t1 period, the LC1 and LC2 signals can not give any influence to the drain node N1 of the first transistor T1a and the drain node N2 of the second transistor T2a. If the LC1 and LC2 signals are transited to a high level in a t2 period, the third and fourth transistors T3a and T4a are turned on by the drain nodes N1 and N2 of the first and second transistors T1a and T2a. Accordingly, the LC1 and LC2 signals at a high level are provided to the first split wordline SWL1 and the second split wordline SWL2 through the third and fourth transistors T3a and T4a. Since there is a capacitance component between sources of the third and fourth transistors T3a and T4a in the split wordline driving signal forwarder 121 and the drain nodes N1 and N2 of the first and second transistors T1a and T2a, voltages on the drain nodes N1 and N2 are boosted as voltages on LC1 and LC2 and the first and second split wordlines SWL1 and SWL2 are boosted. Even though the drain node N1 and N2 voltages are boosted, since the first transistor T1a and the second transistor T2a are in OFF states to the drain node N1 and N2 boosted voltages, the boosted voltages are maintained. Therefore, if the boosted voltages are called Vboost, a voltage as much as Vboost−Vtn can be provided to the third and fourth transistors T3a and T4a. The Vtn is a threshold voltage of an NMOS transistor. Thus, the LC1 signal and the LC2 signal can be provided to the first and second split wordlines SWL1 and SWL2 without loss of Vtn and regardless of LC1 and LC2 voltages. In a t3 period, if only the LC1 signal is transited to a low level, a level of the first split wordline SWL1 is also transited to a low level to return the drain node N1 voltage of the first transistor T1a to a state of the t1 period. Since the second transistor T2a is held in an OFF state to the drain node N2 voltage even in this state during the t3 period, the boosted voltage Vboost is maintained, permits the LC2 signal to be provided to the second split wordline SWL2 without loss of voltage. In a t4 period, the LC1 signal is transited to a high level again, and the LC2 signal is transited to a low level. If the LC2 signal is transited to the low level, a voltage level of the second split wordline SWL2 is also transited to a low level. If the LC1 signal is transited to a high level, the voltage of the first split wordline SWL1 is also transited from the low level to the high level. Consequently, the drain node N1 of the first transistor T1a is boosted to the boosted voltage Vboost level, again. Since the voltage of the drain node N1, which is at the boosted voltage level, is blocked by the first and second transistors T1 and T2, the LC1 signal is provided to the first split wordline SWL1 without loss of voltage. Then, in a t5 period, both the LC1 and LC2 are transited to low levels to transit both the first and second split wordlines SWL1 and SWL2 to be disabled. If the LC1 and LC2 signals are transited to a low level, the voltages of the drain nodes N1 and N2 are transited to a low level, which is controlled by the global wordline GWLn, again. Then, in a t6 period, a selected global wordline is transited to a low level, to disable a pertinent row address.

Figure 14:
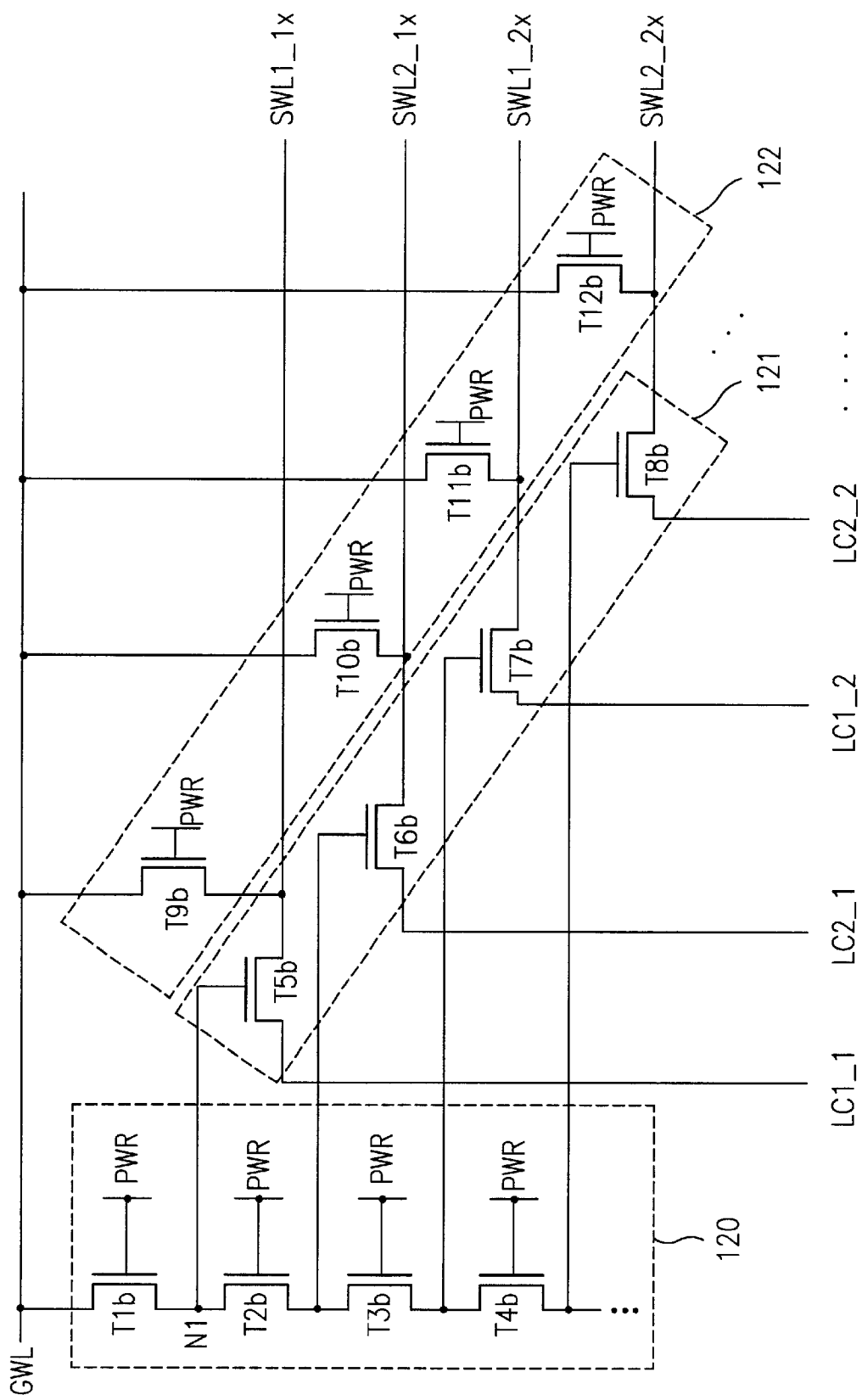
FIG. 14 is a diagram that illustrates a circuit for driving a nonvolatile ferroelectric memory having a plurality of split wordline pairs using FIG. 12.

As shown in FIG. 12, the first preferred embodiment of the circuit for driving nonvolatile ferroelectric memory includes the first and second wordlines SWL1 and SWL2. However, the present invention is not intended to be so limited. For example, the number of split wordlines could vary. The system of FIG. 12 can be repeatedly provided to obtain a system shown in FIG. 14. FIG. 14 is a diagram that illustrates an exemplary circuit for driving a nonvolatile ferroelectric memory having a plurality of split wordline pairs using FIG. 12.

Referring to FIG. 14, the circuit includes an X address signal forwarder 120 having a plurality of NMOS transistors T1b, T2b, . . . , Tnb coupled to a global wordline in series, a split wordline driving signal forwarder 121 having a plurality of NMOS transistors for forwarding control signals LC1_1, LC2_1, LC1_2, LC2_2, . . . , LC1_n, LC2_n from the local controller to a plurality of pairs of the first and second split wordlines SWL1_1, SWL2_1, SWL1_2, SWL2_2, . . . , SWL1_n, SWL2_n under the control of drain voltages of the respective NMOS transistors T1b, T2b, . . . , Tnb, and a bypass 122. The bypass 122 has a plurality of NMOS transistors coupled between the drains of the NMOS transistors in the split wordline driving signal forwarder 121 and the global wordline GWL for bypassing a floating voltage floated on respective split wordlines.

Figure 15:
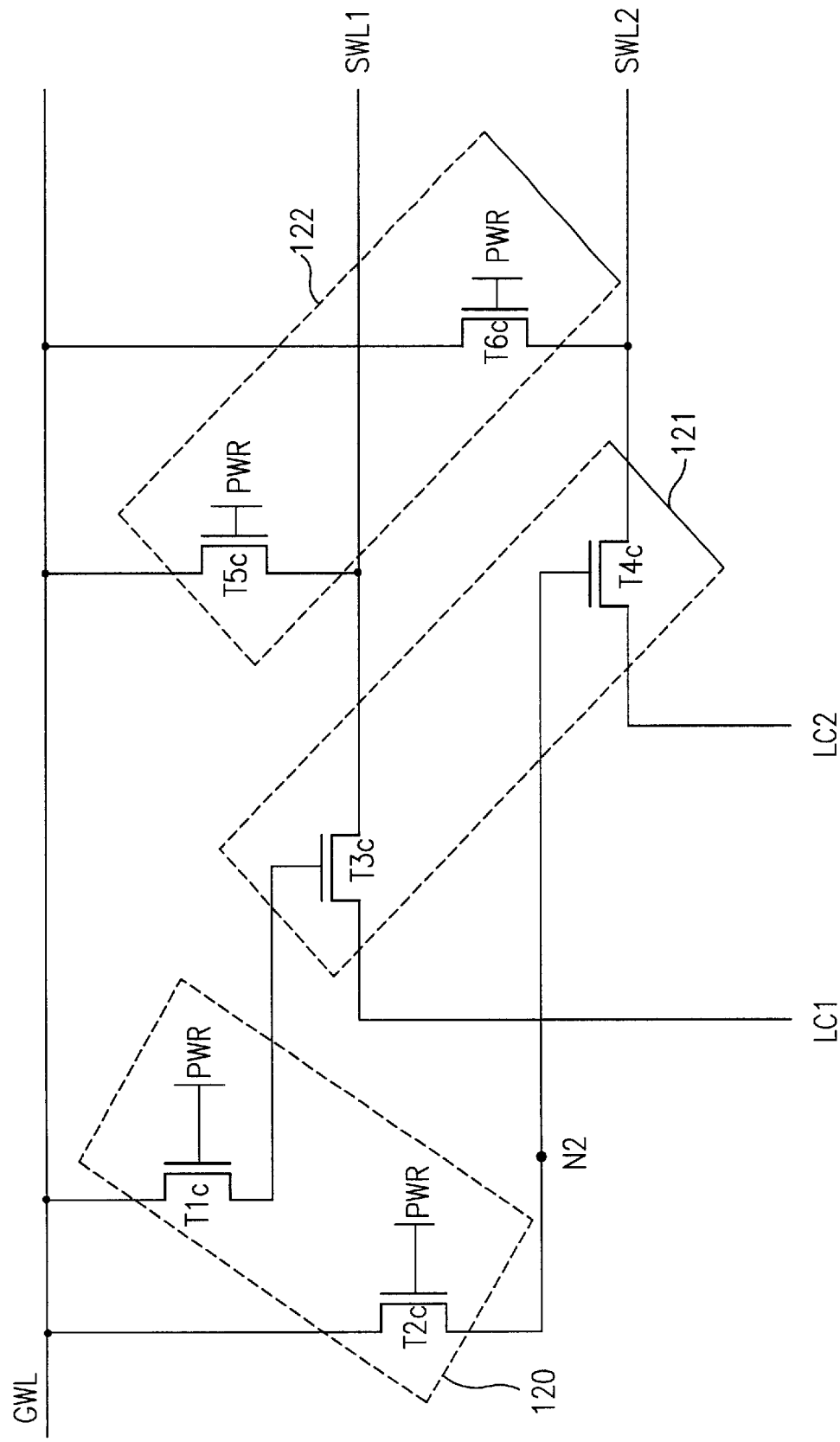
FIG. 15 is a diagram that illustrates a circuit for driving a nonvolatile ferroelectric memory in accordance with a second preferred embodiment of the present invention.

FIG. 15 is a diagram that illustrates a circuit for driving a nonvolatile ferroelectric memory in accordance with a second preferred embodiment of the present invention. In the first preferred embodiment, the first and second transistors (e.g., T1a and T2a) are coupled to the global wordline GWL in series. In the second embodiment, the first and second transistors T1c and T2c are coupled to the global wordline GWL in parallel. A detailed description of a system according to the second preferred embodiment is omitted here as the system is the same as the first preferred embodiment except the first and second transistors T1c and T2c. Since the first and second transistors T1c and T2c are coupled to the global wordline GWL in parallel, the voltage on the drain node N2 of the second transistor T2c is made to be high enough to turn on the fourth transistor T4c. If the drain node N2 is not made high enough by the second transistor T2c, the fourth transistor T4c can not be opened adequately, that causes the LC2 signal to be not sufficiently provided to the second split wordline. The circuit for driving a nonvolatile ferroelectric memory in accordance with a second preferred embodiment of the present invention is also applicable to a nonvolatile ferroelectric memory having a plurality of split wordline pairs as shown in FIG. 14.

Figure 16:
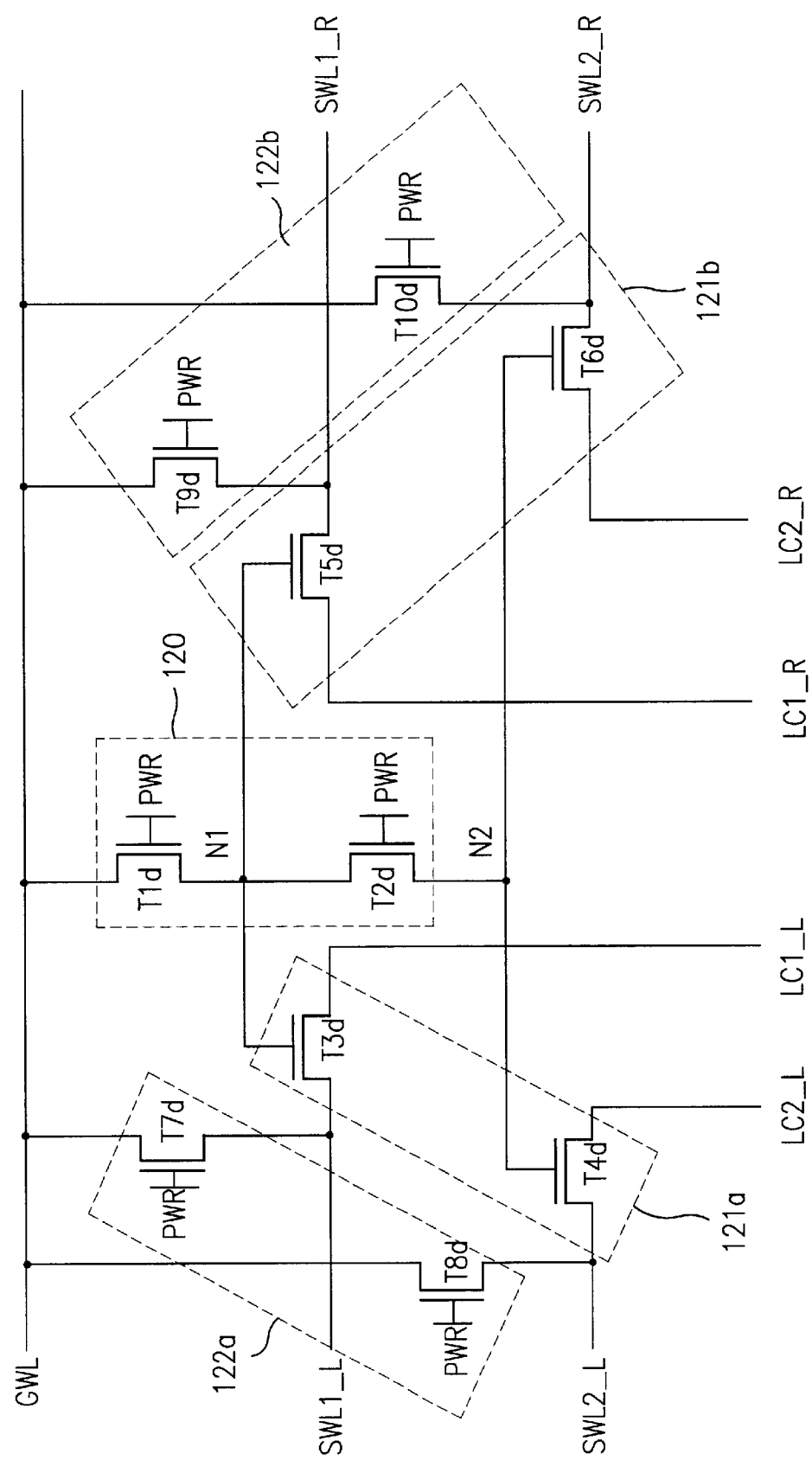
FIG. 16 is a diagram that illustrates a circuit for driving a nonvolatile ferroelectric memory in accordance with a third preferred embodiment of the present invention.

The circuits for driving a nonvolatile memory according to the first and second preferred embodiments of the present invention are shown for a case when the first split wordline driver 65 and the second split wordline driver 65a are applied separately as shown in FIG. 11. If the first and second split wordline drivers 65 and 65a are not separately provided as shown in FIG. 11, the first and second split wordline drivers can be provided in common as one split wordline driver, which drives the main cell array 61 as well as the second main cell array 61a. In this case, the subdrivers may have a system as shown in FIG. 16, which is a diagram that illustrates a circuit for driving a nonvolatile ferroelectric memory in accordance with a third preferred embodiment of the present invention. The SWL1_L, SWL2_L denote split wordlines coupled to the first main cell array 61 in the system shown in FIG. 11, and the SWL1_R, SWL2_R can denote split wordlines coupled to the second main cell array 61a. The LC1_L and LC2_L denote control signals from the first local controller 69, and LC1_R and LC2_R can denote control signals from the second local controller 69a.

Referring to FIG. 16, the circuit for driving a nonvolatile ferroelectric memory in accordance with a third preferred embodiment of the present invention includes a global wordline GWL formed in one direction and coupled to the global X decoder 63, an X address signal forwarder 120 having a first transistor T1d and a second transistor T2d coupled to the global wordline GWL in series and a first split wordline driving signal forwarder 121a. The first split wordline driving signal forwarder 121a has a third transistor T3d for providing the LC1_L signal to the SWL1_L by the control of the voltage on the drain node N1 of the first transistor T1d and a fourth transistor T4d for providing the LC2_L signal to the SWL2_L by the control of the voltage on the drain node N2 of the second transistor T2d. A second split wordline driving signal forwarder 121b has a fifth transistor T5d for providing the LC1_R signal to the SWL1_R by the control of the voltage on the drain node N1 of the first transistor T1d and a sixth transistor T6d for providing the LC2_R signal to the SWL2_R by the control of the voltage on the drain node N2 of the second transistor T2. A first bypass 122a has a seventh transistor T7d coupled between the global wordline GWL and the SWL1_L and an eighth transistor T8d coupled between the global wordline GWL and the SWL2_L, a second bypass 122b having a ninth transistor T9d coupled between the global wordline GWL and the SWL1_R and a tenth transistor T1 coupled between the global wordline GWL and the SWL2_R. The first and second bypasses 122a, 122b preferably have NMOS transistors with very low driving currents for bypassing respective split wordline floating voltages, which remain enabled. The circuit for driving a nonvolatile ferroelectric memory in accordance with a third preferred embodiment of the present invention has the two main cell arrays on both sides thereof (e.g., the first main cell array and the second main cell array), to reduce size and more efficiently use a layout. Because there is no occasion at which the LC1_L and LC2_L and LC1_R and LC2_R transited to high levels on the same time, there will be no occasion when the high level signal is applied to SWL1_L, SWL2_L, and SWL1_R, SWL2_R on the same time. The circuit for driving a nonvolatile ferroelectric memory in accordance with a third preferred embodiment of the present invention can be applied to a nonvolatile ferroelectric memory having a plurality of split wordline pairs, for example, as shown in FIG. 14. The circuits for driving a nonvolatile ferroelectric memory in accordance with the first to the third preferred embodiments of the present invention are cases when the circuits are applied to a nonvolatile ferroelectric memory having split wordlines.

Figure 17:
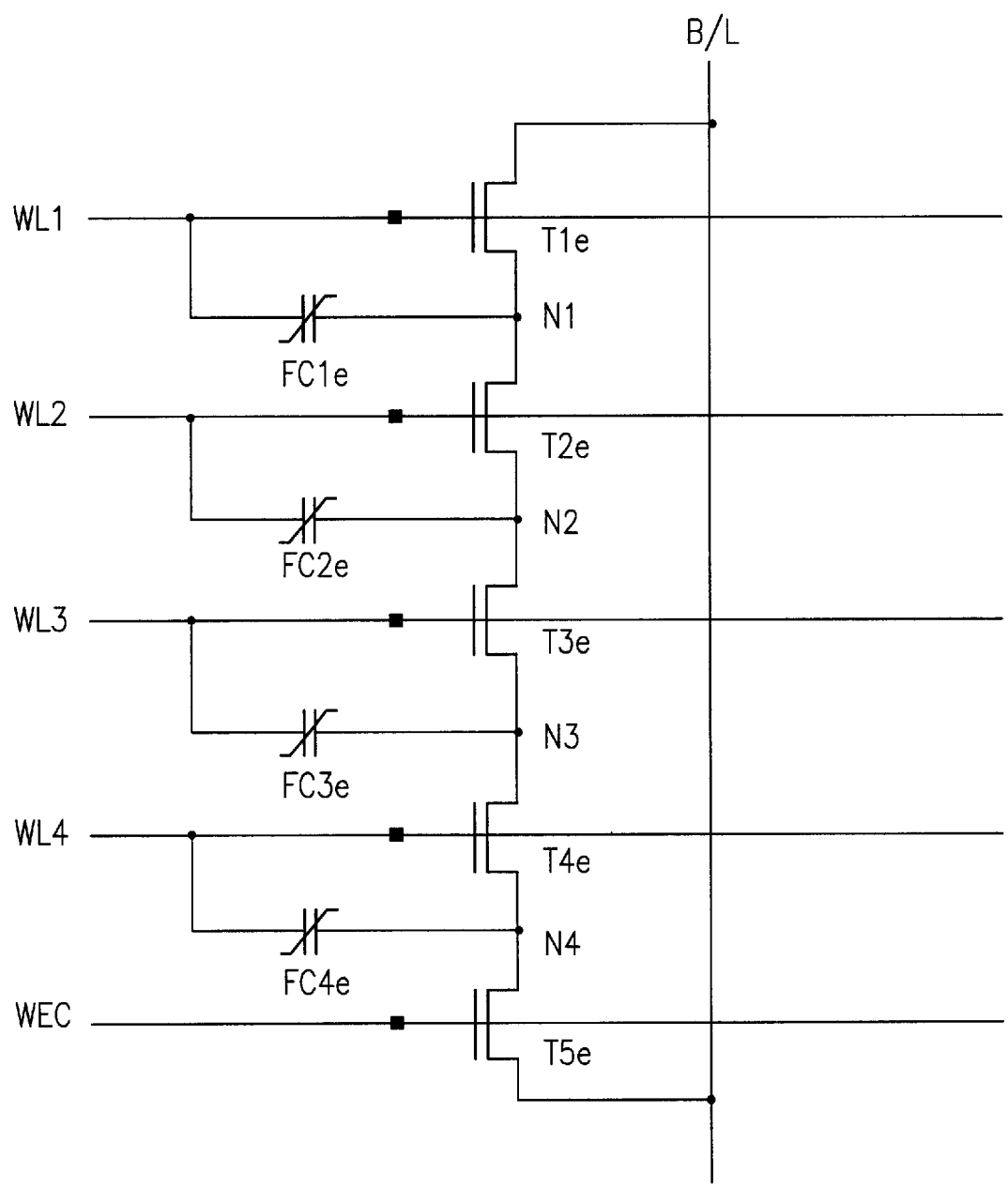
FIG. 17 is a diagram that illustrates a system of general 4-NAND cell.

FIG. 17 is a diagram that illustrates a system of a NAND type nonvolatile ferroelectric memory cell for describing a circuit for driving a nonvolatile ferroelectric memory in accordance with a fourth preferred embodiment of the present invention. A circuit for driving a nonvolatile ferroelectric memory in accordance with the fourth preferred embodiment of the present invention is applicable to a nonvolatile ferroelectric memory having a NAND type cell. FIG. 17 illustrates a system of a NAND type nonvolatile ferroelectric memory cell, such as a 4-NAND type nonvolatile ferroelectric memory cell.

Referring to FIG. 17, there are NMOS transistors T1e, T2e, . . . , T5e coupled in series, and a bitline B/L formed along a direction in which the transistors are formed. Of the plurality of NMOS transistors, a source of the first transistor T1e and a drain of the last transistor T5e are coupled to the bitline B/L. A wordline W/L is coupled to a gate of each of the transistors, and a WEC signal line is coupled to a gate of the last transistor T5e. The WEC signal is a signal in a disabled state in a read mode and in an enabled state only in a write mode. Ferroelectric capacitors FC1e, . . . , FC4e are coupled between the wordlines W/L1, . . . , W/L4 coupled to the gates of the transistors T1e, T2e, T3e and T4e and drains of the same transistors, the last transistor T5e has no ferroelectric capacitor. A memory cell array can be provided by repeating such a 4-NAND type nonvolatile memory cells.

Although, the fourth preferred embodiment uses the 4-NAND type shown in FIG. 17, the present invention is not intended to be so limited. For example, the memory cell array may be provided with 2-NAND type, 3-NAND type, or n-NAND type. The circuit for driving a nonvolatile ferroelectric memory in accordance with the fourth preferred embodiment of the present invention will be described using a system of cell array of the 4-NAND type nonvolatile ferroelectric memory.

Figure 18:
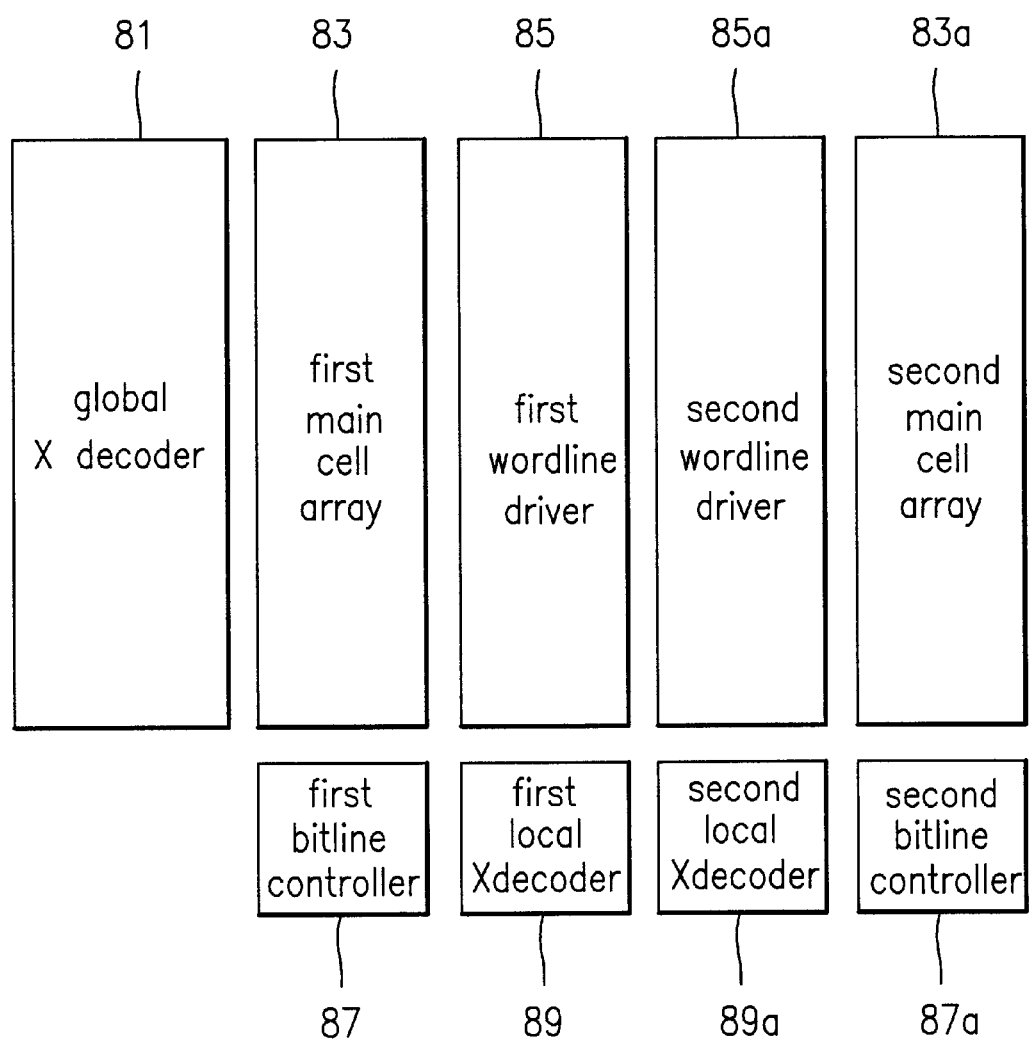
FIG. 18 is a diagram that illustrates a cell array system of 4-NAND type nonvolatile ferroelectric memory.

FIG. 18 is a diagram that illustrates a cell array system of 4-NAND type nonvolatile ferroelectric memory. Referring to FIG. 18, the cell array system of 4-NAND type nonvolatile ferroelectric memory includes a global X decoder 81, a first main cell array 83 formed on one side of the global X decoder 81, a first wordline driver 85 formed on one side of the first main cell array 83, a second wordline driver 85a formed on one side of the first wordline driver 85 and a second main cell array 83a formed on one side of the second wordline driver 85a. A first bitline driver 87 is formed under the first main cell array 83, a first local X decoder 89 is formed under the first wordline driver 85 on one side of the first bitline driver 87, a second local X decoder 89a is formed on one side of the first X decoder 89, and a second bitline controller 87a is formed under the second main cell array 83a on one side of the second local decoder 89a. The system is preferably provided repeatedly, where the first and second main cell arrays 83 and 83a serve as a main cell array and a reference cell array respectively, each of which has a plurality of unit cells. The unit cell is the NAND type nonvolatile ferroelectric memory cell, such as 4-NAND type or multi-NAND type nonvolatile ferroelectric memory cell. The global X decoder 81 controls a plurality of global wordlines GWL. The first and second local X decoders 89 and 89a provide enable signals LXDEC1~LXDECn for enabling wordlines of the NAND type cell in a sequence and a WEC signal. The first and second wordline drivers 85 and 85a have a plurality of sub-drivers each coupled to the global wordline.

Figure 19:
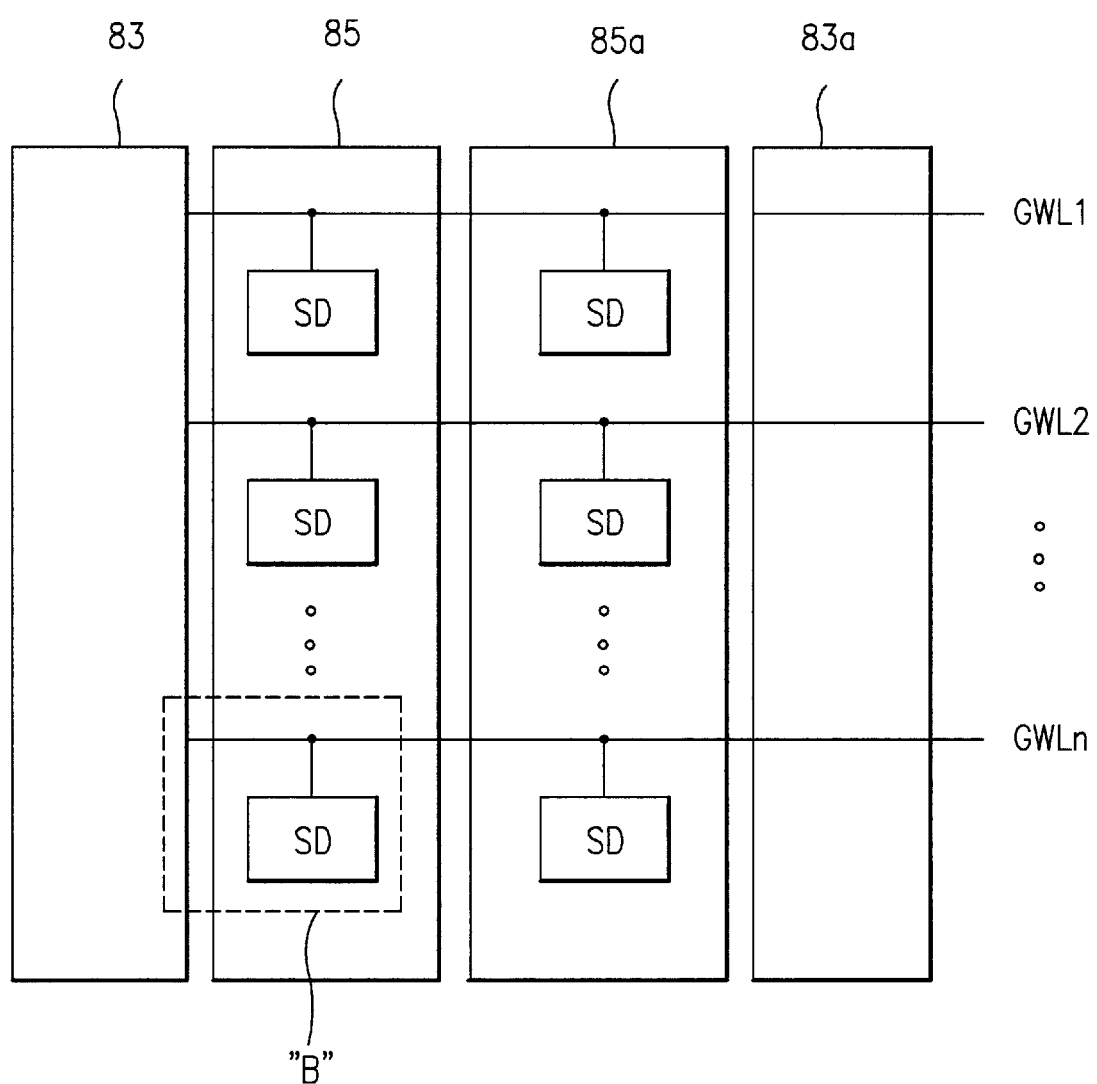
FIG. 19 is a diagram that illustrates additional detail of FIG. 18, wherein the cell array system is shown centered on the wordline driver.

FIG. 19 is a diagram that illustrates additional detail of the cell array system shown in FIG. 18 centered on the wordline driver. Referring to FIG. 19, there are the first wordline driver 85 and a second wordline driver 85a disposed in parallel, on opposite sides of which the first main cell array 83 and the second main cell array 83a are disposed for effective utilization of a layout or reduced layout. As shown in the FIG. 19, the first and second wordline drivers 85 and 85a each have a plurality of sub-drivers. The global X decoder 81 has a plurality of global wordlines GWL1, GWL2, . . . , GWLn coupled thereto. Each of the global wordlines GWL1, GWL2, . . . , GWLn preferably has a sub-driver SD coupled thereto. The first and second wordline drivers 85 and 85a preferably have as many sub-drivers as the global wordlines. And, each global wordline has the sub-driver of the first wordline driver 85 and the sub-driver of the second wordline driver 85a coupled thereto in common.

Figure 20:
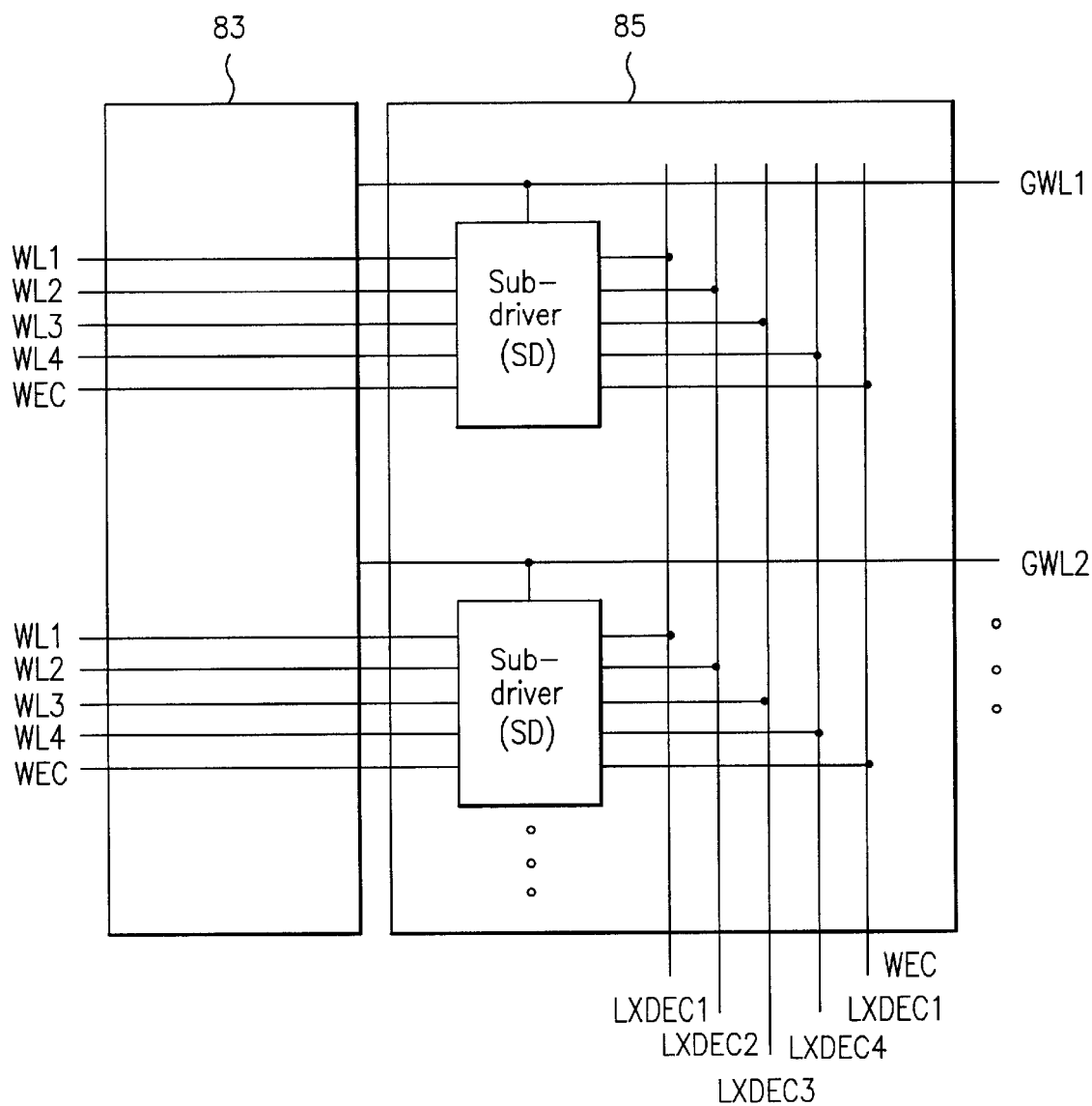
FIG. 20 is a diagram that illustrates additional detail of "B" part in FIG. 19 where connections between signals from a local X decoder arid a sub-driver in accordance with a fourth embodiment of the present invention are shown.

FIG. 20 is a diagram that illustrates a "B" part in FIG. 19 showing connections between signals from a local X decoder and a sub-driver in accordance with the fourth embodiment of the present invention. Referring to FIG. 20, a sub-driver of the fourth preferred embodiment according to the present invention is operative in response to the global wordline GWL signal from the global X decoder to apply, for example, the signals LXDEC1~LXDEC4, WEC from the local X decoder to the wordlines WL1~WL4 in a sequence. The WEC signal is a signal enabled only in a write mode or in a re-storage mode.

Figure 21:
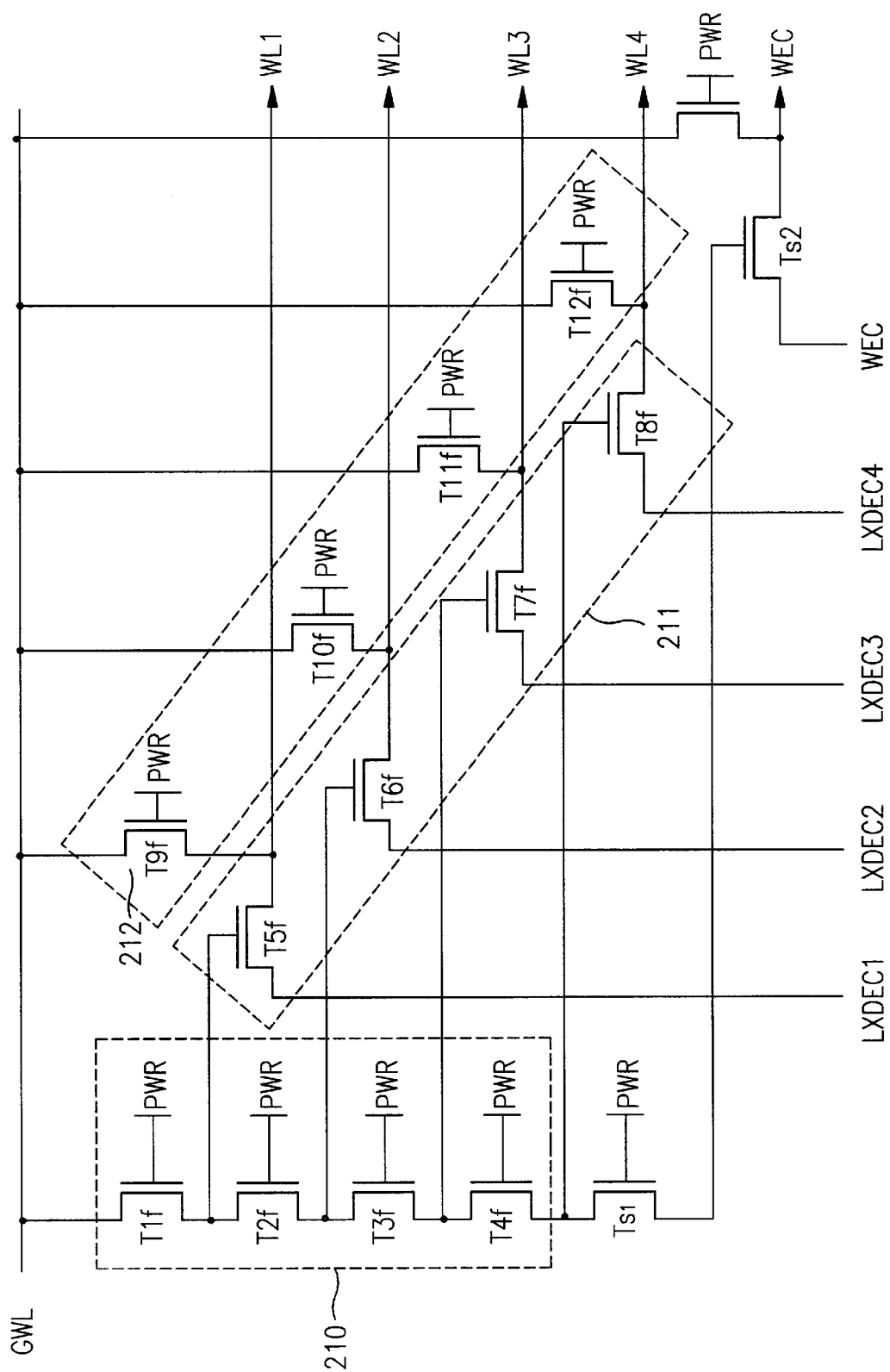
FIG. 21 is a diagram that illustrates a circuit for driving a nonvolatile ferroelectric memory in accordance with a fourth preferred embodiment of the present invention.

FIG. 21 is a diagram that illustrates a circuit for driving a nonvolatile ferroelectric memory in accordance with the fourth preferred embodiment of the present invention. The driving circuit shown in FIG. 21 is an exemplary sub-driver shown in FIG. 20.

Referring to FIG. 21, a sub-driver includes an X address signal forwarder 210 having four NMOS transistors T1$f$, T2$f$, T3$f$ and T4$f$ coupled to the global wordline GWL, which is coupled to the global X decoder 81 (not shown) in series. A wordline driving signal forwarder 211 having NMOS transistors T5$f$, T6$f$, T7$f$ and T8$f$ is adapted to be controlled by a drain voltage of respective transistors in a sequence for applying signals LXDEC1~LXDEC4 from the local X decoder 89 (not shown) to the wordlines WL1~WL4 in a prescribed sequence. A bypass 212 preferably has NMOS transistors T9$f$, T10$f$, T11$f$ and T12$f$ coupled between a drain terminal of each of the NMOS transistors T5$f$, T6$f$, T7$f$ and T8$f$ and the global wordline GWL, for bypassing the floating voltage on each wordline. The local X decoder preferably provides a WEC signal together with LXDEC1~LXDEC4 signals. The drain of the NMOS transistor T4$f$ in the X address signal forwarder 210 has a first switching transistor $T_{S1}$ coupled thereto, and there is a second switching transistor $T_{S2}$ for switching the WEC signal under the control of a drain voltage of the first switching transistor $T_{S1}$.

In the circuit for driving a nonvolatile ferroelectric memory in accordance with the fourth preferred embodiment, as the NMOS transistors T1$f$~T4$f$ in the X address signal forwarder 210 are turned on in sequence, the NMOS transistors T5$f$~T8$f$ in the wordline driving signal forwarder 211 coupled to drains of the NMOS transistors T1$f$~T4$f$ are turned on in sequence, which causes the signals LXDEC1~LXDEC4 in the local X decoder to be applied to the wordlines WL1~WL4 in sequence, and the WEC signal is last applied. The bypass 212 having NMOS transistors T9$f$~T12$f$ coupled between the global wordlines GWL and each of the wordlines WL1~WL4 bypasses a floating voltage on each wordline WL1~WL4. When both the global wordline GWL and the LXDEC1~LXDEC4 signal are at low levels, the wordline WL1~WL4 are in a floated state where the bypass 212 bypasses the floated voltage induced to the wordline to the global wordline GWL through the NMOS transistors T9$f$, T10$f$, T11$f$ and T12$f$. The NMOS transistors T9$f$~T12$f$ have very low driving currents, and are always turned on. Thus, by preventing the wordlines WL1~WL4 from being floated, unwanted selection of cell data is prevented by reducing or eliminating a possibility of the unwanted data caused by noise or the like form acting as an actual data in advance. As FIG. 21 is a diagram that illustrates a case when the unit cell is n-NAND type (e.g., n=4), the local X decoder provides LXDEC1~LXDECn signals together with the WEC signal. Further, an 'n' number of NMOS transistors coupled in series to the global wordline GWL are also provided in the X address signal forwarder 210, and an 'n' number of NMOS transistors coupled to drains of the above 'n' NMOS transistors respectively are also provided in the wordline driving signal forwarder 211.

Operations of the circuit for driving a nonvolatile ferroelectric memory in accordance with the fourth preferred embodiment of the present invention will now be described. As the global wordline GWL is enabled, the transistor T1$f$ is turned on, to transit a drain of the transistor T1$f$ to a high level, which in turn turns on the transistor T5$f$. Accordingly, the LXDEC1 signal from the local X decoder is provided to the wordline WL1 through the transistor T5$f$ to enable the wordline WL1. In this case, the rest of the transistors remain turned off in a disabled state. As the wordline WL1 is enabled, the data stored in the ferroelectric capacitor (e.g., FC1e) is provided to the bitline through the NMOS transistor T1f. According to the same process, T2f, T3f and T4f are turned on in succession, to read of the data stored in the corresponding ferroelectric capacitors (e.g., FC2e, FC3e and FC4e) in succession.

Figure 22:
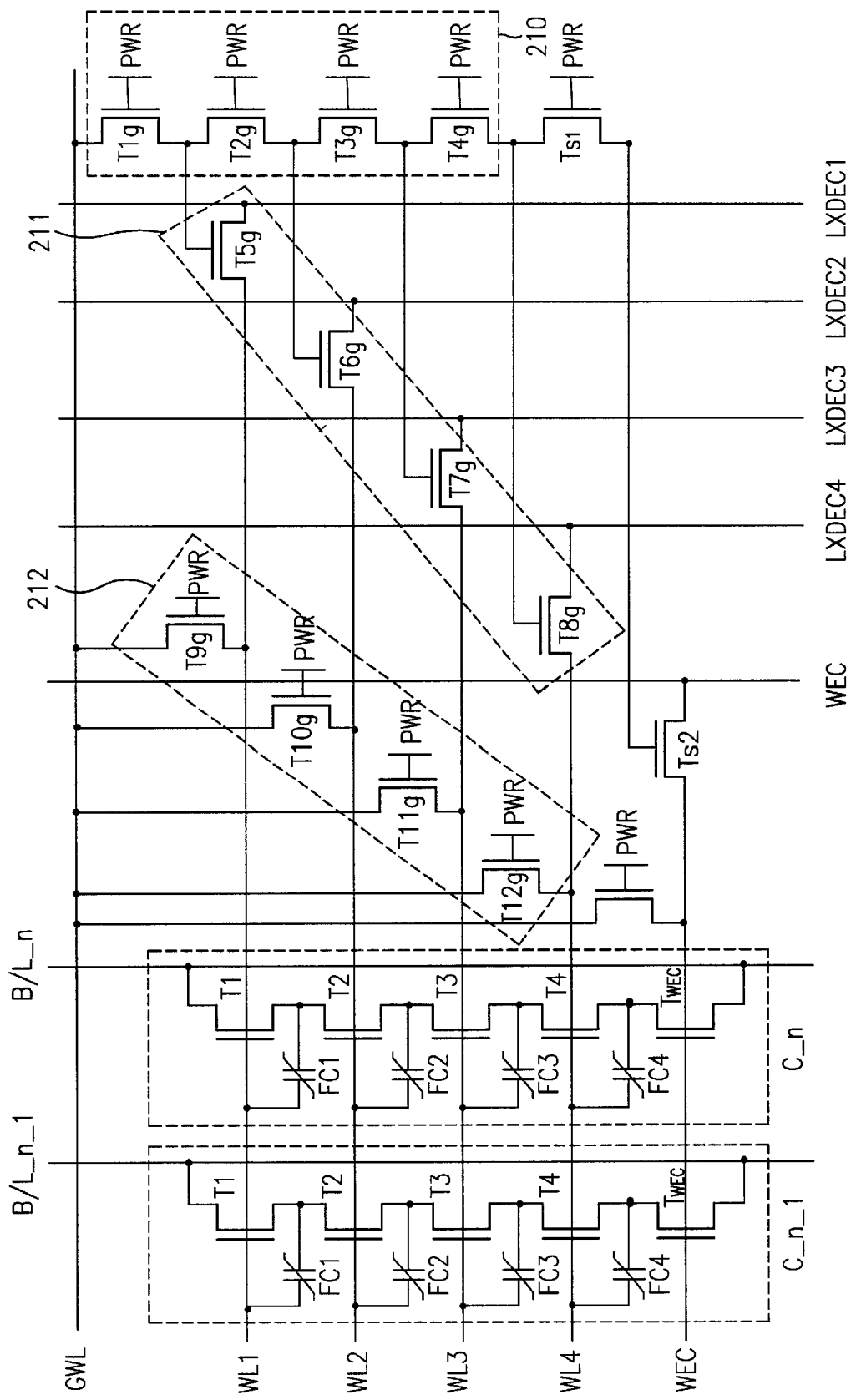
FIG. 22 is a diagram that illustrates a relation of the fourth embodiment circuit for driving a nonvolatile ferroelectric memory of the present invention with the cell array in more detail.

FIG. 22 is a diagram that illustrates a relation of the fourth preferred embodiment of the circuit for driving a nonvolatile ferroelectric memory according to the present invention with the cell array. Referring to FIG. 22, there is at least one global wordline GWL extending in a row direction, and there are a plurality of bitlines . . . , B/L_n-1, B/L_n extending along a direction crossing global wordlines. A 4-NAND cell is coupled in correspondence to each bitline as a unit cell, and there is an X address signal forwarder 210 having four NMOS transistors T1g~T4g connected to the global wordline GWL. Although the preferred embodiments are not intended to be so limited. The unit cell could be a 1-NAND, 2-NAND, 3-NAND, 5-NAND or noted type cell. A wordline driving signal forwarder 211 having four NMOS transistors T5g~T8g for applying control signals from the local X decoder to wordlines WL1~WL4 of the main cell array is coupled to the drains of the NMOS transistors T1g~T4g. A bypass 212 having four NMOS. transistors T9g~T12g is coupled between the global wordline GWL and the drains of the NMOS transistors T5g~T8g in the wordline driving signal forwarder 211 for bypassing the floating voltages of the wordlines WL1~WL4. As shown in FIG. 22, the WEC signal, which is held disabled in a read mode and enabled in a write mode, is provided from the local X decoder, together with signals LXDEC1~LXDEC4. The drain of the fourth NMOS transistor T4g in the X address signal forwarder 210 has a first switching transistor $T_{S1}$ coupled thereto, and there is a second switching transistor $T_{S2}$ provided additionally for switching the WEC signal to a WEC line of the main cell array under the control of a drain voltage of the first switching transistor $T_{S1}$.

Figure 23:
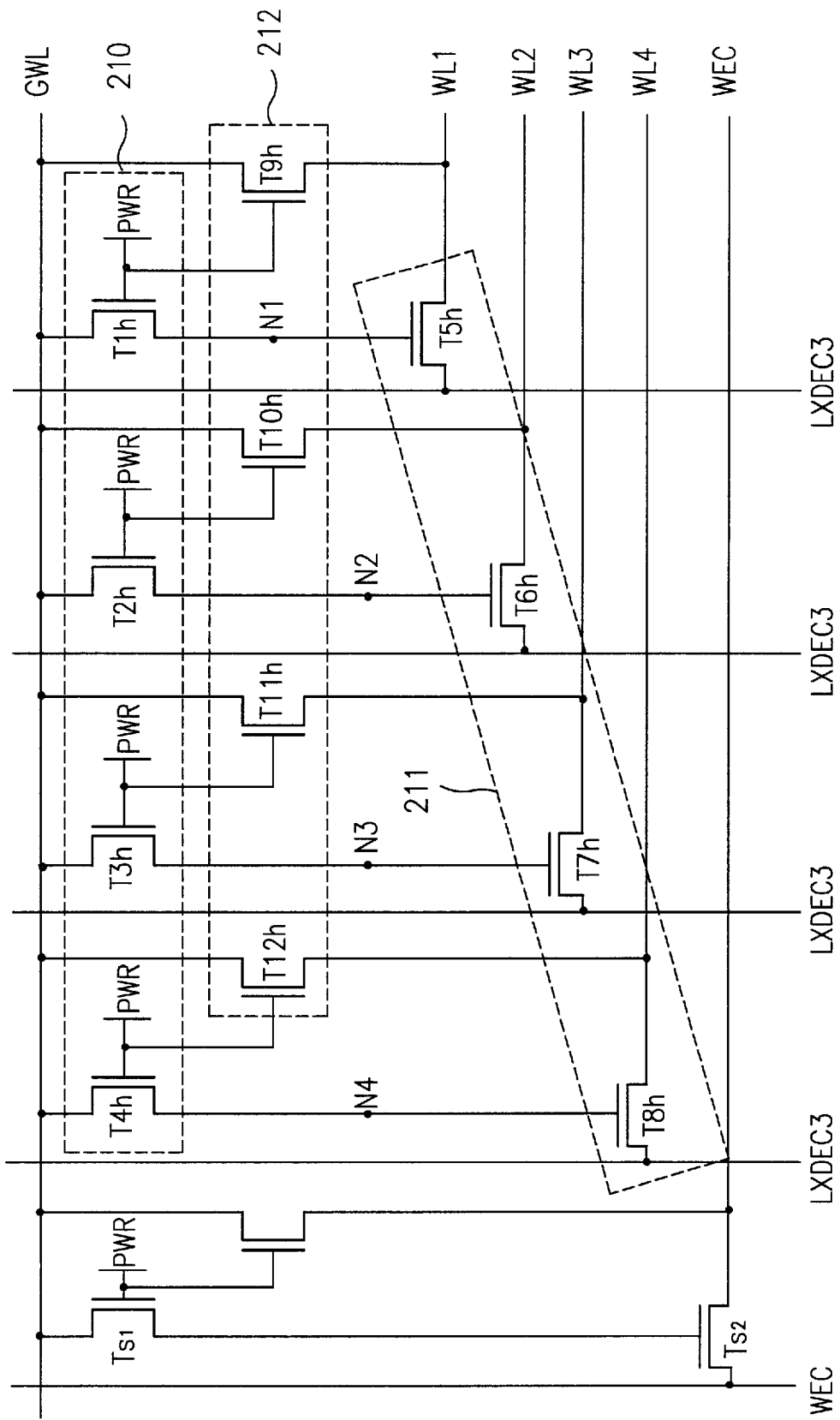
FIG. 23 is a diagram that illustrates a circuit for driving a nonvolatile ferroelectric memory in accordance with a fifth preferred embodiment of the present invention.

FIG. 23 is a diagram that illustrates a circuit for driving a nonvolatile ferroelectric memory in accordance with a fifth preferred embodiment of the present invention. Referring to FIG. 23, the circuit for driving a nonvolatile ferroelectric memory in accordance with the fifth preferred embodiment of the present invention includes a global wordline GWL, an X address signal forwarder 210 having four NMOS transistors T1h~T4h coupled in parallel to the global wordline GWL and adapted to be turned on in succession, a wordline driving signal forwarder 211 having four NMOS transistors T5h, T6h, T7h and T8h with gates coupled to drains of the NMOS transistors T1h~T4h for providing LXDEC1~LXDEC4 signals from the local X decoder to the wordlines WL1~WL4 in succession by drain voltages and a bypass 212. The bypass 212 hour has four NMOS transistors T9h~T12h coupled between the wordlines and the global wordline GWL for bypassing floating voltages on the wordlines. A first switching transistor $T_{S1}$ is coupled to the global wordline GWL together with the four NMOS transistors T1h~T4h, and a second switching transistor $T_{S2}$ is coupled for switching a WEC signal controlled by a drain voltage of the first switching transistor $T_{S1}$. The NMOS transistors T1h~T4h, T9h~T12h, $T_{S1}$ and $T_{S2}$ are preferably always held enabled. In comparison to the fourth preferred embodiment, the fifth preferred embodiment according to the present invention has the NMOS transistors T1h~T4h coupled in parallel to the global wordline GWL so that the drain node N4 of the transistor T4h has a voltage high enough to turn on the transistor T8h. If the drain node N4 is not boosted to a high level adequately by the transistor T4h, the transistor T8h can not be adequately opened, which impedes an adequate provision of the LXDEC4 signal to the wordline WL4.

As described above, the preferred embodiments of a circuit for driving a nonvolatile ferroelectric memory according to the present invention have various advantages. By decoding row direction address signals at a decoder (e.g., X decoder) by making all row direction cell arrays have the address signals in common, and by making the row controllers (first, second, or third preferred embodiments) or the row X decoder (fourth or fifth preferred embodiments) select cell wordline, a system of the wordline driver can be simplified. Further, the effective utilization of an layout area reduces or minimizes an overall area or size, which is favorable to or increases integration. The wordline drivers solely composed of NMOS transistors can improve a current driving capability on the same size basis in comparison to the case when PMOS transistors are used. In addition, the local control signals LC1, LC2, LC3, . . . , or the control signals LXDEC1, LXDEC2, . . . from the local X decoder can be provided to the wordlines unchanged without loss of Vtn (e.g., without loss using only NMOS transistor).

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory, the memory comprising:
   a memory array having a plurality of memory cells, pairs of first and second wordlines extending along a first direction spaced from each other, each pair of first and second wordlines corresponding to one of a plurality of global wordlines extending in the first direction, and a plurality of bitlines extending in a second direction crossing the wordline pairs, each memory cell coupled to a corresponding pair of first and second wordlines and a corresponding bitline;
   a first address circuit coupled to a global wordline to output first control signals; and
   a wordline driving signal circuit coupled to the first address circuit and the corresponding pair of first and second wordlines that receives the first control signals to enable the corresponding the first and second wordlines.

2. The memory of claim 1, wherein the first address circuit has a first plurality of transistors coupled to the corresponding global wordline, wherein the wordline driving signal circuit has a second plurality of transistors each providing a driving signal for one of the corresponding pair of the first and second wordlines, wherein each of the second plurality of transistors is controlled by an output signal of one of the first plurality of transistors.

3. The memory of claim 2, wherein the first plurality of transistors is coupled in series to the global wordline.

4. The memory of claim 2, wherein the first plurality of transistors is coupled in parallel to the global wordline.

5. The memory of claim 2, wherein the transistors are NMOS transistors.

6. The memory of claim 2, wherein the driving signal for driving said one of the corresponding pair of the first and second wordlines is provided from a local controller.

7. The memory of claim 2, further comprising a bypass circuit that couples the global wordline and the corresponding pair of the first and second wordlines, wherein the bypass circuit comprises a third plurality of transistors, and wherein the plurality of transistors in the first address circuit and the bypass circuit are maintained enabled.

8. The memory of claim 7, wherein the third plurality of transistors in the bypass circuit are NMOS transistors each having a small driving current.

9. The memory of claim 2, wherein each output terminal of the second plurality of transistors in the wordline driving signal circuit is coupled to said one of the corresponding pair of the first and second wordlines.

10. The memory of claim 1, wherein the memory is a nonvolatile ferroelectric memory, wherein each of the cells is a unit cell including a switching transistor and a ferroelectric capacitor both between each of the corresponding pair of first and second wordlines and the corresponding bitline, and wherein each of the wordline pairs is a split wordline.

11. A semiconductor memory device, comprising:
a memory array having pairs of first and second wordlines extending along a first direction spaced from each other, each pair corresponding to one of a plurality of global wordlines extending in the first direction, a plurality of bitlines extending in a second direction crossing the wordline pairs, a plurality of cell arrays having cells respectively coupled to a corresponding pair of first and second wordlines and a corresponding bitline; and a split wordline driver that selectively provides a driving signal to at least two of the cell arrays; and
a driving circuit that comprises,
a first address signal forwarder that includes a plurality of first transistors coupled to a global wordline in series, and
a plurality of wordline pair driving signal forwarders coupled in parallel between the first address signal forwarder and corresponding pairs of first and second wordlines respectively coupled to first and second cell arrays to drive the corresponding pairs of first and second wordlines.

12. The circuit of claim 11, wherein the wordline pair driving signal forwarders include a plurality of second transistors each controlled by corresponding output voltages of the plurality of first transistors, respectively.

13. The memory device of claim 12, further comprising:
a bypass circuit that includes a plurality of third transistors coupled between the global wordline and the pairs of first and second wordlines to bypass floating voltages on the pairs of first and second wordlines.

14. The circuit of claim 13, wherein the plurality of first and third transistors remain turned on.

15. The circuit of claim 14, wherein the plurality of first transistors are NMOS transistors and the plurality of third transistors in the bypass circuit are NMOS transistors having small driving currents.

16. The circuit of claim 11, wherein a first wordline pair driving signal forwarder that applies a driving signal to the corresponding pair of first and second wordlines coupled to first cell array, and a second wordline pair driving signal forwarder that applies a driving signal to the corresponding pair of first and second wordlines coupled to the second cell arrays are both coupled to the first address signal forwarder.

17. The circuit of claim 11, wherein the memory array is a nonvolatile ferroelectric memory, wherein each of the cells is a unit cell including a switching transistor and a ferroelectric capacitor both between each of the corresponding pair of first and second wordlines and the corresponding bitline, and wherein each of the wordline pairs is a split wordline.

18. A circuit for driving a memory, the memory including a cell array of multi-NAND memory cells each with a plurality of transistors coupled in series to a bitline, wherein each of the transistors has a control electrode coupled to one of a plurality of wordlines, the circuit comprising:
an address signal circuit coupled to a global wordline to output first control signals, wherein the address signal circuit is controlled by a global decoder; and
a wordline driving circuit that selectively applies a plurality of second control signals to the wordlines in sequence according to the first control signals, wherein the address signal circuit comprises a plurality of first transistors, wherein the wordline driving circuit comprises a plurality of second transistors each receiving a corresponding first control signal at a control electrode and coupled by an output electrode to a corresponding one of the wordlines.

19. The circuit of claim 18, wherein the first transistors are coupled in series to the global wordline.

20. The circuit of claim 18, wherein the first transistors are coupled in parallel to the global wordline.

21. The circuit of claim 18, wherein the global decoder outputs a plurality of wordline driving signals to control the address signal circuit and an enable control signal that is disabled in a read mode and enabled in a write mode.

22. The circuit of claim 18, further comprising a switching transistor coupled to a last one of the plurality of second transistors to selectively apply an enable control signal that is disabled in a read mode and enabled in a write mode to a control line disposed together with the plurality of wordlines.

23. The circuit of claim 18, further comprising a first switching transistor coupled to a last one of the plurality of first transistors to control a second switching transistor for applying an enable control signal to a control line disposed together with the plurality of wordlines.

24. The circuit of claim 18, further comprising a bypass circuit coupled between the wordlines and the global wordline.

25. The circuit of claim 24, wherein the transistors are NMOS transistors, wherein the bypass circuit comprises a third plurality of transistors, wherein the first transistors and the third transistors are maintained in an enabled state, wherein the first transistors and the third transistors have small driving currents, and wherein the memory is a nonvolatile ferroelectric memory.

26. The circuit of claim 18, wherein each of the memory cells is a unit cell including a switching transistor and a ferroelectric capacitor both between each of a corresponding pair of first and second wordlines and the bitline, and wherein each of the corresponding pairs of first and second wordline forms a split wordline.

* * * * *

UNITED STATES PATENT AND TRADEMARK OFFICE
CERTIFICATE OF CORRECTION

PATENT NO. : 6,418,043 B1 Page 1 of 1
DATED : July 9, 2002
INVENTOR(S) : Kang

It is certified that error appears in the above-identified patent and that said Letters Patent is hereby corrected as shown below:

<u>Title page,</u>
Item [63], please replace the Related U.S. Application Data as follows:

-- [63] Continuation-in-part of application No. 09/243,474, filed on Feb. 3, 1999, now Pat. No. 6,091,624, and is a CIP of application No. 09/229,335, filed on Jan. 13, 1999, now Pat. No. 6/128,213 and is a CIP of application No. 09/229,992, filed Jan. 14, 1999, now Pat. No. 6,091,623, which are CIPs of application No. 09/210,783, filed Dec. 15, 1998, now Pat. No. 6,091,622, which is a CIP of application No. 09/187,735, filed Nov. 9, 1998, now Pat. No. 6,125,051, which is a CIP os application No. 09/055,985, filed Apr. 7, 1998, now Pat. No. 6,118,687. --

Signed and Sealed this

Nineteenth Day of November, 2002

*Attest:*

*Attesting Officer*

JAMES E. ROGAN
*Director of the United States Patent and Trademark Office*